(12) United States Patent
Kawamura et al.

(10) Patent No.: US 9,891,989 B2
(45) Date of Patent: Feb. 13, 2018

(54) STORAGE APPARATUS, STORAGE SYSTEM, AND STORAGE APPARATUS CONTROL METHOD FOR UPDATING STORED DATA STORED IN NONVOLATILE MEMORY

(71) Applicant: Hitachi, Ltd., Tokyo (JP)

(72) Inventors: Atsushi Kawamura, Tokyo (JP); Akira Yamamoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/769,205

(22) PCT Filed: Oct. 11, 2013

(86) PCT No.: PCT/JP2013/077748
§ 371 (c)(1),
(2) Date: Aug. 20, 2015

(87) PCT Pub. No.: WO2015/052833
PCT Pub. Date: Apr. 16, 2015

(65) Prior Publication Data
US 2015/0378816 A1 Dec. 31, 2015

(51) Int. Cl.
*G06F 11/10* (2006.01)
*G06F 3/06* (2006.01)
*G11C 29/52* (2006.01)

(52) U.S. Cl.
CPC .......... *G06F 11/1068* (2013.01); *G06F 3/064* (2013.01); *G06F 3/0619* (2013.01);
(Continued)

(58) Field of Classification Search
CPC ............. G06F 11/1008; G06F 11/1056; G06F 11/1068; G06F 11/1076; G06F 11/108; G06F 11/1088; G06F 11/1092; G06F 11/1096; G06F 3/0619; G06F 3/064; G06F 3/0688; G06F 12/16; G11C 29/52
See application file for complete search history.

(56) References Cited

U.S. PATENT DOCUMENTS 5,572,660 A * 11/1996 Jones ................ G06F 11/1076
714/6.12
2011/0066793 A1 * 3/2011 Burd ................ G06F 11/1028
711/103

(Continued)

OTHER PUBLICATIONS

International Search Report of PCT/JP2013/077748.

*Primary Examiner* — Albert Decady
*Assistant Examiner* — Christian Dorman
(74) *Attorney, Agent, or Firm* — Mattingly & Malur, PC

(57) ABSTRACT

A control device stores information associating each of a plurality of physical areas with a plurality of logical areas. The control device respectively stores a plurality of first user data included in a first stripe and a first parity data created on the basis thereof in each of the plurality of physical areas, and, in accordance with receiving a write request for updated user data that updates the user data, which is stored in a first physical area, for a first logical area associated with the first physical area, creates a second parity data on the basis of a data group formed using the updated user data and a plurality of second user data that differs from the plurality of first user data.

11 Claims, 23 Drawing Sheets

(52) U.S. Cl.
CPC ........ *G06F 3/0688* (2013.01); *G06F 11/1096* (2013.01); *G11C 29/52* (2013.01); *G06F 11/108* (2013.01); *G06F 11/1056* (2013.01); *G06F 11/1076* (2013.01); *G06F 11/1088* (2013.01)

(56) References Cited

U.S. PATENT DOCUMENTS

| | | | |
|---|---|---|---|
| 2011/0078496 A1* | 3/2011 | Jeddeloh | G06F 3/0616 714/6.24 |
| 2011/0082967 A1* | 4/2011 | Deshkar | G06F 12/0246 711/103 |
| 2011/0258380 A1* | 10/2011 | Goss | G06F 11/108 711/114 |
| 2012/0005402 A1* | 1/2012 | Yamamoto | G06F 3/0616 711/103 |
| 2012/0072680 A1* | 3/2012 | Kimura | G06F 11/108 711/154 |
| 2012/0297133 A1* | 11/2012 | Sundrani | G06F 11/1076 711/113 |
| 2013/0019062 A1 | 1/2013 | Bennett et al. | |
| 2013/0139030 A1* | 5/2013 | Okubo | G06F 11/1048 714/755 |

\* cited by examiner

FIG.8

| RG# | Status | Number of valid pages | Next write location | Degradation level |
|---|---|---|---|---|
| 0 | Writable | 100 | B#7 P#2 | Low |
| 1 | Unused | 0 | 0 | Low |
| 2 | Write-complete | 230 | N/A | Medium |
| 3 | Erasable | 0 | N/A | High |
| ... | ... | ... | ... | ... |
| RG management table | | | | |

| Block # | Affiliated RG | Degradation level |
|---|---|---|
| 0 | 0 | Low |
| 1 | 1 | Low |
| 2 | 3 | Medium |
| 3 | 4 | High |
| ... | ... | ... |
| Block management table | | |

| RG# | Physical page | Logical page |
|---|---|---|
| 0 | B#0 P#0 | L# 0 |
|  | B#0 P#1 | L# 12 |
|  | B#0 P#2 | Unallocated |
|  | ... | ... |
| 1 | ... | ... |
| Reverse-lookup management table |||

| RG# | Block 0 | Block 1 | Block 2 | Block 3 |
|---|---|---|---|---|
| 0 | B# 0 | B# 10 | B# 5 | B# 6 |
| 1 | B# 100 | B# 101 | B# 102 | B# 103 |
| … | … | … | … | … |
| RG configuration information | | | | |

| RG# 0 degradation level low | B# 0 degradation level low | B# 2 degradation level low | B# 4 degradation level low | B# 5 degradation level low |

| RG# 1 degradation level high | B# 1 degradation level high | B# 3 degradation level high | B# 6 degradation level high | B# 7 degradation level high |

STORAGE APPARATUS, STORAGE SYSTEM, AND STORAGE APPARATUS CONTROL METHOD FOR UPDATING STORED DATA STORED IN NONVOLATILE MEMORY

TECHNICAL FIELD

The present invention relates to a storage apparatus having nonvolatile semiconductor memory.

BACKGROUND ART

Advances in semiconductor technology in recent years have led to the development of nonvolatile semiconductor memory capable of being accessed at high speed. Such a nonvolatile semiconductor memory, for example, is NAND-type flash memory. A storage apparatus that uses flash memory as a storage medium is much better at saving power and shortening access time than a storage apparatus that has a plurality of small disk drives. Thus, system performance can be enhanced by utilizing a flash memory storage medium-equipped storage apparatus as a storage system, as the final storage medium in a server, and/or as cache memory.

In a flash memory, a block is a storage area unit for a batch erase of data, and a page is a storage area unit for reading and writing data. Hereinafter, unless otherwise noted, simply referring to either a block or a page will indicate either a physical block or page in a flash memory. In a flash memory, a plurality of pages is disposed in a single block. Also, a direct rewrite of data stored in a flash memory is not possible. That is, when rewriting stored data, the flash memory first saves stored valid data to a dynamic random access memory (DRAM) or to another block. Next, the flash memory erases the stored data in block units. Then, the flash memory writes the data to the erased block (s). In this way, the rewriting of data in a flash memory accompanies the block-by-block erasing of data. The characteristics of the flash memory are such that cells in which data is stored degrade when data erases are executed. When cells degrade, data error rates increase, and repeated erases make the cells unusable. Thus, the number of block erases is limited.

Flash memory failures will be explained next.

As flash memory failures, in addition to retention errors caused by the above-described cell degradation and data retention time overruns, sudden failures due to circuit malfunctions such as broken wiring, and other such hardware device malfunctions are known. These sudden failures are not generally a function of cell use frequency, and as such, cannot be dealt with using the above-described wear leveling and other such approaches.

Thanks to advances in semiconductor micro-fabrication technologies in recent years, flash memories capable of high-density recording are being manufactured, but error incidence rates have tended to increase in line with increases in failures and number of erases.

The number of data erases of specific blocks inside a solid state drive (SSD), which is a storage apparatus that uses flash memory, increases, resulting in cases where the blocks become unusable, sudden failures occur, and the SSD as a whole no longer has enough capacity to be provided externally despite the fact that the other blocks (area) are in sound condition.

To deal with this, a method for providing redundancy inside the flash memory is conceivable. In a storage apparatus that uses a hard disk drive (HDD) or other such disk apparatus, this method is called redundant arrays of inexpensive disks (RAID). A single unit of redundancy is called a RAID group (RG). Systems corresponding to RAID levels that are defined by RAID are also considered ways of providing redundancy.

As a technique for enhancing reliability by providing redundancy inside an SSD, a control method in a case where a RAID-configured memory is managed as a single module and numerous such modules are lined up side by side is known (for example, Patent Literature 1).

CITATION LIST

Patent Literature

[PTL 1]
US Patent Application Publication No. 2013/0019062 (Specification)

SUMMARY OF INVENTION

Technical Problem

In the case of RAID that is configured using HDD and requires the creation of parity data (referred to as parity hereinbelow), when a certain piece of data is updated, data in a physical area associated with a logical area in which the data is stored must be rewritten to reflect the updated data, and the parity associated with the data must be created anew and rewritten to reflect the updated parity. By contrast, data stored in a physical area of a nonvolatile semiconductor memory such as a flash memory cannot be rewritten. Thus, when a certain piece of data is updated, the updated data and updated parity in logical areas are respectively written to unused physical areas, after which the relationship between the physical areas and the logical areas in which the updated data and updated parity were stored must also be updated.

However, since this system also generates a write of the newly created updated parity in line with the write of the updated data, the amount of writes to the nonvolatile semiconductor memory is two times the amount of writes requested from a higher-level apparatus, and affects the performance of the storage apparatus. Also, in a nonvolatile semiconductor memory (for example, a flash memory), the number of block erases is limited, and increases in the amount of writes leads to increases in the number of erases, shortening life.

Solution to Problem

In order to solve the above problems, a storage apparatus, which is one aspect of the present invention, comprises a plurality of nonvolatile semiconductor memory chips and a control device that is connected to a higher-level apparatus. The control device stores transformation information respectively associating an arbitrary plurality of physical areas inside the plurality of nonvolatile semiconductor memory chips with a plurality of logical areas provided to the higher-level apparatus. The control device respectively stores a plurality of first user data included in a first stripe and a first parity data, created on the basis of the plurality of first user data, in the respective plurality of physical areas, and, in accordance with receiving a write request for updated user data that updates the user data, which is stored in a first physical area, for a first logical area associated with the first physical area of the plurality of physical area, creates a second parity data on the basis of a data group formed using the updated user data and a plurality of second user data that differs from the plurality of first user data. The control device stores the updated user data, and the plurality of second user data and the second parity data included in a second stripe in each of an arbitrary plurality of physical areas that differ from the plurality of physical areas, and in the transformation information associates the second physical area, in which the updated user data has been stored, with the first logical area.

Advantageous Effects of Invention

According to the present invention, it is not necessary to update parity each time data is updated. Accordingly, in a storage apparatus that uses nonvolatile semiconductor memory as the storage media, it is possible to hold down number of parity writes to the nonvolatile semiconductor memory while enhancing reliability by creating parity for the data.

BRIEF DESCRIPTION OF DRAWINGS

FIG. 8 shows an RG management table 307.
FIG. 9 shows a block management table 308.
FIG. 10 shows a reverse-lookup management table 309.
FIG. 11 shows an example of an RG configuration table 310.
FIG. 20 shows an example of a method for configuring an RG 406.

DESCRIPTION OF EMBODIMENTS

Several examples of the present invention will be explained below using the drawings. These examples are merely examples for realizing the present invention, and do not limit the technical scope of the present invention.

Example 1

The configuration of a computer system of this example will be explained below.

Figure 1:
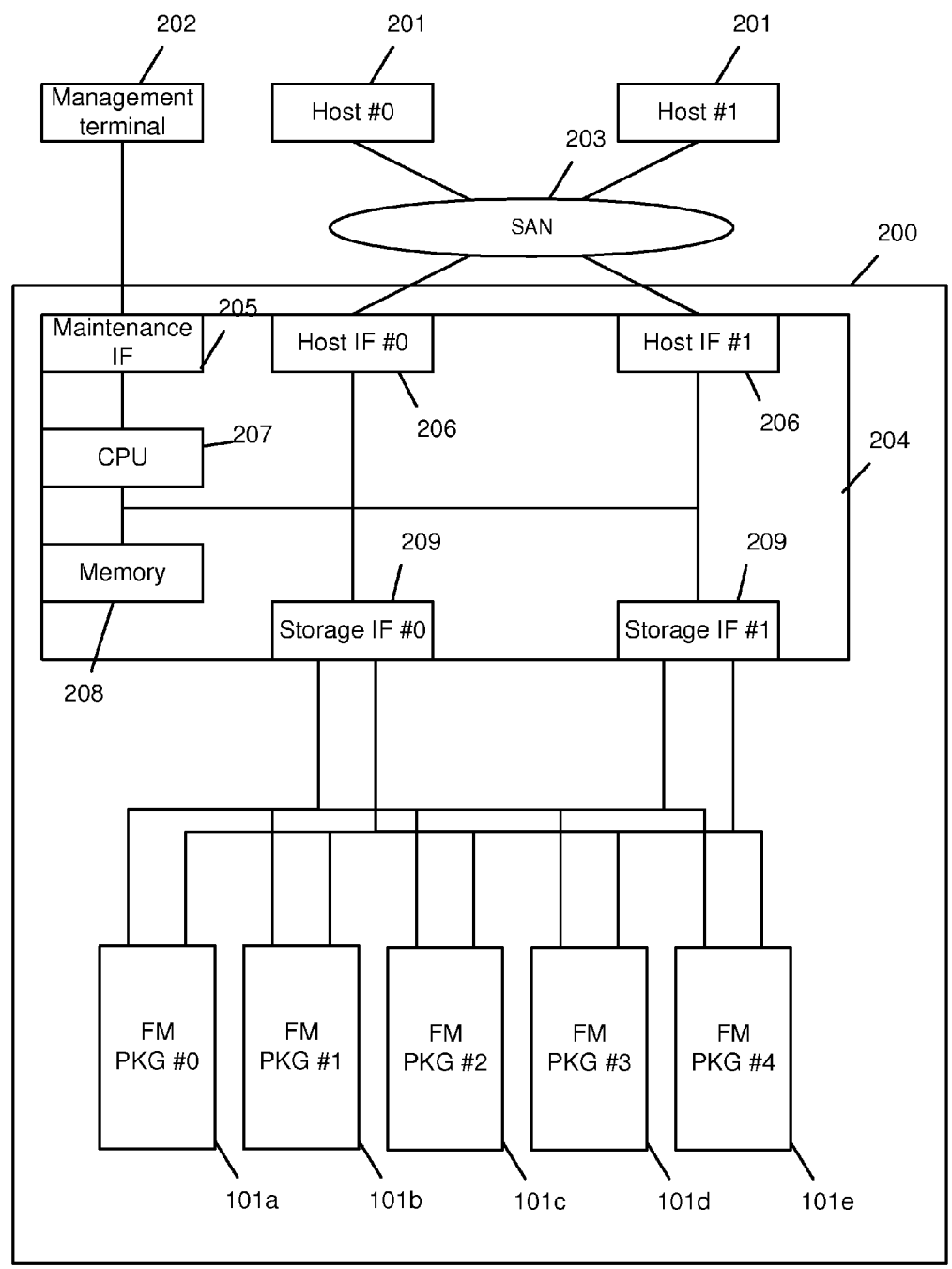
FIG. 1 shows the configuration of a computer system of a first example.

FIG. 1 shows the configuration of a computer system of the first example.

A computer system comprises a storage system 200, one or more host computers 201, and a management terminal 202. Each of the host computers #0 and #1 is connected to the storage system 200 via a storage area network (SAN) 203.

The storage system 200 comprises a storage controller 204 and a plurality of flash memory storage apparatuses 101. In the drawings and in the explanation that follows, a flash memory storage apparatus may be called a flash memory package (FMPKG). Furthermore, in this example, there is one storage controller 204, but a redundancy configuration may be employed using a plurality of storage controllers 204.

The storage controller 204 comprises a central processing unit (CPU) 207, a memory 208, a plurality of host interfaces (IFs) 206, a plurality of storage interfaces (IFs) 209, and a maintenance interface (IF) 205. The components inside the storage controller 204 are connected via a bus. The memory 208 comprises an area for storing programs for controlling the storage system 200 and an area that serves as a cache memory for temporarily storing data. The CPU 207 controls the storage system 200 in accordance with the programs stored in the memory 208.

The host IF 206 is for communicating with the computer 201. The storage IF 209 is connected to the FMPKG 101, and is for communicating with the FMPKG 101. The maintenance IF 205 is connected to the management terminal 202, and is for communicating with the management terminal 202.

An administrator manages and maintains the storage controller 204 from the management terminal 202. However, the management terminal 202 is not an essential element, and, for example, the management and maintenance of the storage controller 204 may be performed from the host computer 201.

In the above-described computer system, the host computers 201 and the FMPKGs 101 are connected via the storage controller 204, but, for example, the storage controller 204 may be omitted and the host computers 201 and the FMPKGs 101 may be connected directly.

The configuration of the FMPKG 101 will be explained below. The basic configuration is the same for the plurality of FMPKGs 101.

Figure 2:
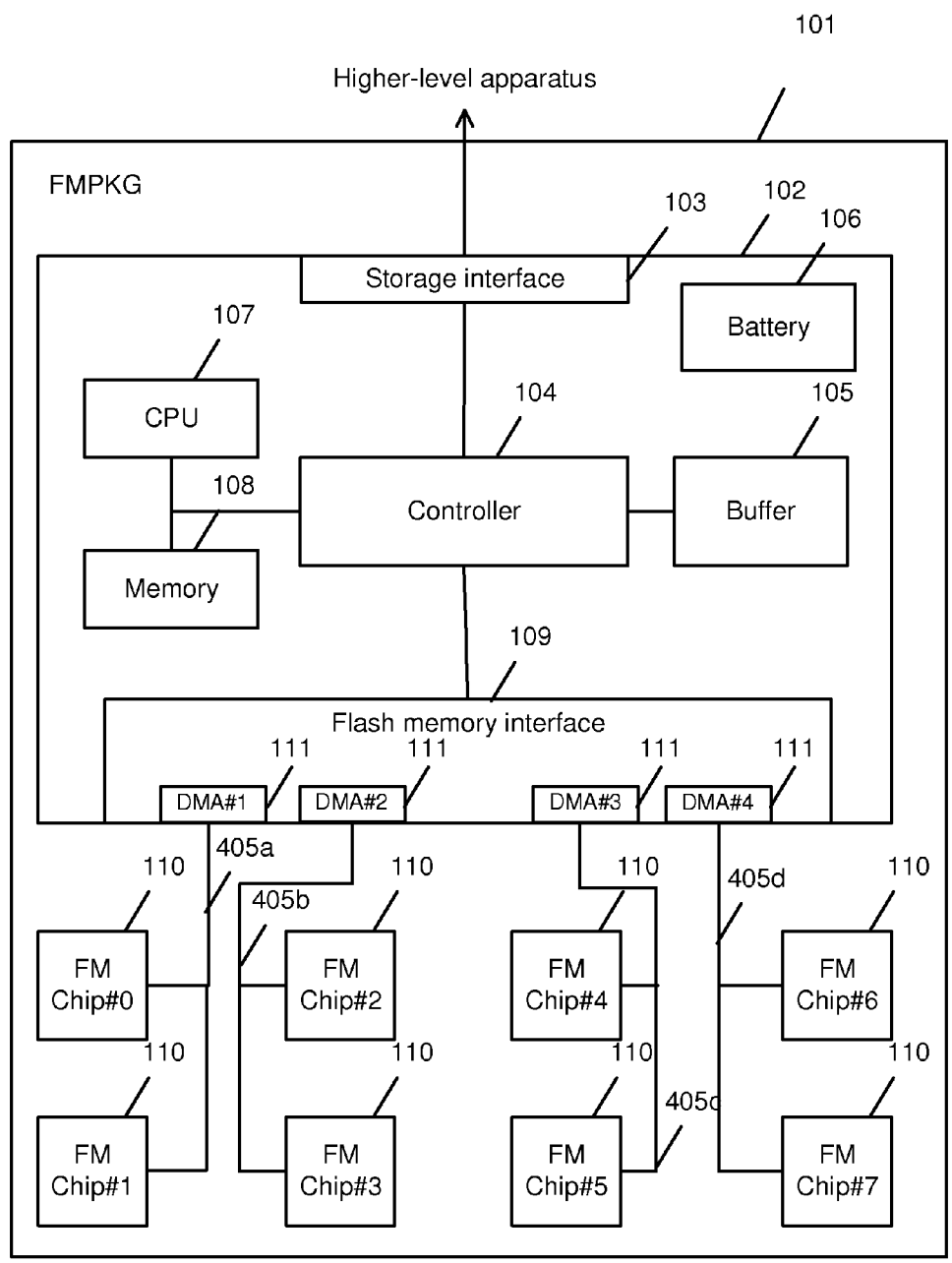
FIG. 2 shows the configuration of a flash memory storage apparatus 101.

FIG. 2 shows the configuration of the FMPKG 101.

The FMPKG 101 comprises a flash memory control apparatus 102 and one or more flash memory chips 110. In the drawings and explanations that follow, the flash memory chip 110 may be called an FM chip. In the drawings and explanations that follow, the flash memory control apparatus 102 may be called an FM control apparatus.

The FM control apparatus 102 comprises a storage interface 103, a flash memory controller 104, a buffer 105, a battery 106, a CPU 107, a main memory 108, and a flash memory interface 109. In the drawings and explanations that follow, the flash memory controller 104 may be called an FM controller. Also, the storage interface 103 may be called either a storage IF (interface) or a higher-level interface. The flash memory interface 109 may be referred to as either a FMIF (flash memory interface) or a lower-level interface, and the main memory 108 is referred to as a memory.

The FM control apparatus 102 is connected to a higher-level apparatus via the storage IF 103, and communicates with the higher-level apparatus. As used here, a higher-level apparatus may be the storage controller 204 or the host computer 201. The storage IF 103, for example, may employ a serial advanced technology attachment (SATA), a serial attached small computer system interface (SAS), a fibre channel (FC) or other such storage interface, and may employ a peripheral components interconnect (PCI)-Express or other such bus interface. The storage IF 103 receives an input or output (I/O) request from the higher-level apparatus.

The FMIF 109 comprises a plurality of direct memory access (DMA) controllers 111. One or more FM chips 110 are connected to each DMA controller 111 via a bus 405. Specifically, for example, FM chip #4 and FM chip #5 are connected to DMA controller #3 via bus 405c. In the following explanation and in the drawings, a DMA controller 111 may simply be called a DMA.

The CPU 107 is a processor for controlling the entire FM control apparatus 102, and operates on the basis of a microprogram stored in the memory 108. For example, in response to an I/O request received from the higher-level apparatus, the CPU 107 refers to information for logical-to-physical transformation (for example, a logical-physical transformation table 306 described below) that is stored in the memory 108, and controls either a read or write of data from/to a plurality of FM chips 110. The CPU 107 also executes reclamation and/or wear leveling in accordance with the usage status of an FM chip 110.

The FM controller 104 is controlled by the CPU 107, and executes either a read or write of data from/to an FM chip 110. The FM controller 104 also controls communications with the higher-level apparatus through the storage IF 103.

The FM control apparatus 102 of this example is provided with the CPU 107 external to the FM controller 104. However, the FM controller 104 may be configured using a single large-scale integration (LSI) including the CPU 107, and higher-level and lower-level interfaces. The FM controller 104 and the CPU 105 may be another control device.

The memory 108 and the buffer 105 are volatile storage areas that enable faster access, and, for example, are dynamic random access memory (DRAM). The memory 108 is a workspace that is used by the CPU 107 in direct control, and provides a shorter latency than the buffer 105. Alternatively, the buffer 105 is for buffering data, and stores large-size information that is unable to be stored in the memory 108. In this example, the FM control apparatus 102 is provided with the memory 108 and the buffer 105 as separate storage areas, but the memory 108 and the buffer 105 may also be provided as a single storage area.

The battery 106, for example, supplies power to the FM control apparatus 102 when the supply of power to the FM control apparatus 102 from outside is cut off.

The internal architecture of the FM control apparatus 102 is not limited to this example, and the respective functions may be substituted for using one or a plurality of devices.

Figure 3:
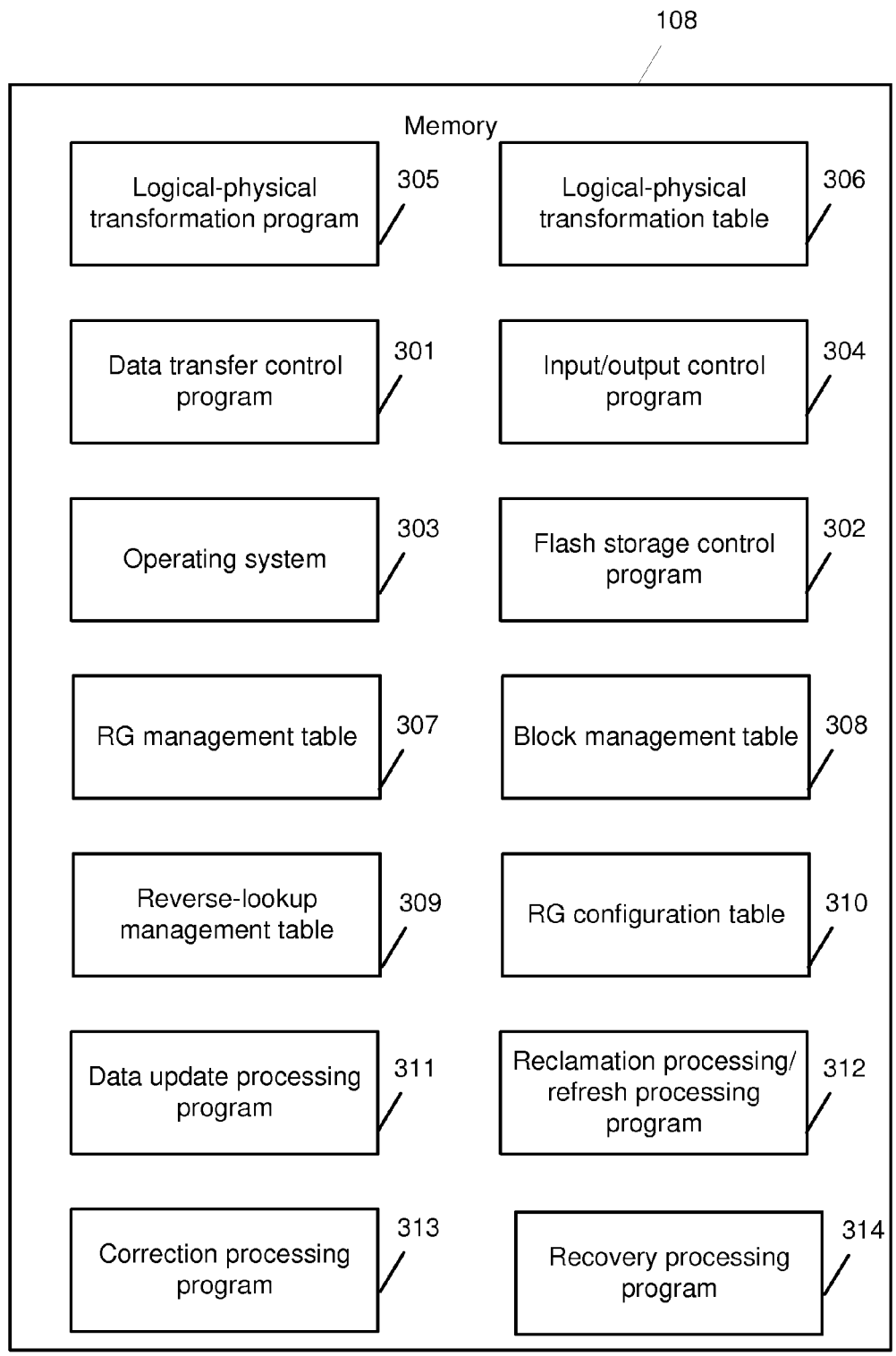
FIG. 3 shows the configuration of a memory 108.

FIG. 3 shows the configuration of the memory 108.

The memory 108, for example, stores an operating system 303, a flash storage control program 302, a data transfer control program 301, an input/output control program 304, a logical-physical transformation program 305, a logical-physical transformation table 306, an RG management table 307, a block management table 308, a reverse-ground management table 309, an RG configuration table 310, a data update processing program 311, a reclamation processing/refresh processing program 312, and a correction processing program 313.

The operating system 303 performs scheduling and other such basic processing when the CPU 107 executes the respective programs.

The flash storage control program 302 carries out controls for the FM control apparatus 102 to operate as a storage device, such as managing a logical area that the FM control apparatus 102 provides to the higher-level apparatus, and managing the buffer 105.

The data transfer control program 301 controls the FM controller 104.

The input/output control program 304 controls the storage IF 103 and the FMIF 109.

The logical-physical transformation program 305 acquires an I/O request issued from the higher-level apparatus, and uses the logical-physical transformation table 306 to identify a physical area corresponding to the logical area specified in the I/O request. For example, the logical-physical transformation program 305 translates a logical address in the logical area to a physical address on the FM chip 110. In this example, the "logical address" is expressed in logical page units and the location of a logical page is expressed using a logical page number, but the logical address may be the logical block address (LBA) that indicates the start of the logical page. In this example, the "physical address" is expressed in physical page units and the location of a physical page is expressed using a combination of a block number and a physical page number, but the physical address is not limited thereto. The location of the physical page may be a physical address indicating the start of the physical page. The logical-physical transformation program 305 also manages the logical-physical transformation table 306, and registers and changes the information in the logical-physical transformation table 306.

The logical-physical transformation table 306 is information for a logical-physical transformation used when the logical-physical transformation program 305 operates.

The RG management table 307 is information for managing an RG of the FMPKG 101.

The block management table 308 is information for managing a block of the FMPKG 101.

The reverse-lookup management table 308 is information for a logical-physical transformation.

The RG configuration table 310 is configuration information for the RG of the FMPKG 101.

The data update processing program 311, the reclamation processing/refresh processing program 312, and the correction processing program 313 will be described below.

Figure 4:
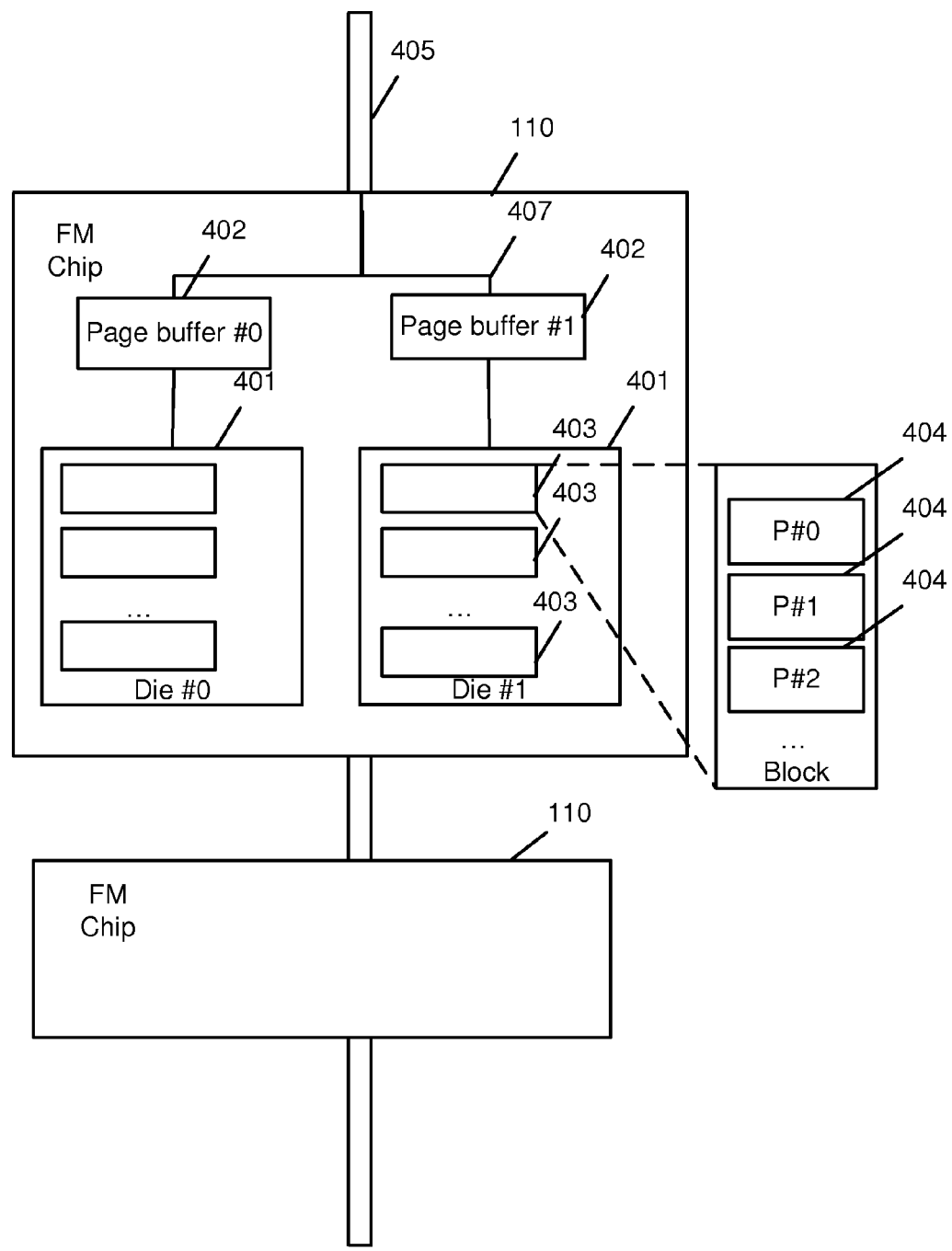
FIG. 4 is a drawing for illustrating a connection status and internal configuration of a flash memory chip 110.

FIG. 4 is a drawing for illustrating the connection status and internal configuration of the FM chip 110.

A plurality of FM chips 110 is connected to a single bus 405.

The FM chip 110 comprises a plurality of dies 401 and a plurality of page buffers 402. The page buffer 402 temporarily stores data targeted by an I/O command issued from the FM control apparatus 102.

One or more dies 401 are connected to the page buffer 402 via a bus 407 inside the FM chip 110. The page buffer 402, for example, is a DRAM or other such volatile semiconductor memory. The die 401, for example, is a NAND-type flash memory or other such nonvolatile semiconductor memory. In this example, page buffer #0 is connected to die #0, and page buffer #1 is connected to die #1. Each die 401 comprises a plurality of blocks 403. In this example, erase processing is performed in block 403 units. The block 403 comprises a plurality of physical pages 404. In this example, a read and a write are performed in physical page 404 units.

As used here, a write is the writing of data to an erased physical page 404, and a read is the reading of data stored in a physical page 404. A rewrite to a physical page 404 in which data has been stored is not possible, and erase processing must be executed for the block 403 that includes the physical page 404. In accordance with an erase process, all the data stored in the physical pages 404 included in the block 403 is erased, and a write is possible once again. In the following explanation, an erased physical page 404 may be referred to as an empty page. Furthermore, it is not possible to perform an erase process in physical page 404 units.

The FM chip 110 receives a write command, a read command, or an erase processing command from the FMIF 109 of the FM control apparatus 102.

The physical pages 404 are 2 KBytes, 4 KBytes, and 8 KBytes in size, and 128, 256, and so forth physical pages 404 make up a block 403.

The time it takes to erase data from a single block 403 of the FM chip 110 is approximately one digit place longer than the time required to write data to a single page 404. Therefore, when the FM chip 110 performs a one-block 403 data erase every time data is rewritten to a single page 404, the data rewrite performance of the FM chip 110 declines. When the storage medium is an FM chip 110, data may be written to the flash memory using an algorithm that conceal the time it takes to erase the data from the FM chip 110.

Normally, a data rewrite operation to an FM chip 110 is performed using a system that writes the data once to an unused area. However, when data rewrites are repeated, the unused areas in the FM chip 110 decrease, giving rise to the need to erase unnecessary data that has been written to the FM chip 110 to create a state in which the storage area is capable of being reused. Accordingly, a block regeneration process for copying only valid data in the block 403 including the old data to an unused area, and creating a state in which the copy-source block 403 is erased and made reusable is known. The block regeneration process is called reclamation (reclamation may be abbreviated and written as RC below). A reclamation is executed for a block 403 with a lot of invalid data.

In an FM chip 110, the read error rate increases over time in a page 404 in which data has been written. The increased error rate is due to the data retention characteristics of the FM chip 110. That is, electrons held in a cell steadily escape. An error that occurs due to the passage of time is called a retention error. In order to avoid retention errors, a process for copying a page 404 for which a fixed period of time has elapsed after a write to another page 404 is known. The process is called refresh hereinbelow (refresh may be abbreviated and written as RF below).

According to the data retention characteristics described above, the FM chip 110 degrades in line with an increase in the number of times a cell is erased. Therefore, vendors of SSD, which is a storage apparatus that makes use of flash memory, generally indicate the maximum number of erases for which data retention can be guaranteed. When the number of data erases for a specific block 403 increases and the block 403 becomes unusable, it may become impossible for the FM chip 110 to satisfy total capacity despite the fact that the other blocks (areas) 403 are in a sound state. Thus, an equalization process (may be referred to as wear leveling below) that evenly distributes the number of erases of the blocks 403 so that degradation does not occur for only specific blocks 403 is known.

In order to conceal the data erase time and equalize the number of data erases as described hereinabove, the flash memory controller 104 inside the storage system 200 performs a logical-physical address transformation process for translating a logical address to a physical address at the time of a data write. The flash memory controller 104, for example, stores information for the logical-physical address transformation process as the logical-physical address transformation table 306 described hereinabove. Hereinbelow, the logical-physical address transformation process may be called a logical-physical transformation, and the logical-physical address transformation table may be called a logical-physical transformation table.

The logical-physical transformation plays an important role for using flash memory efficiently. When a logical-physical transformation having a low degree of freedom is used, the size of the logical-physical transformation table 306 can be curbed, but the trade-off is that performance drops due to recurring reclamations. Alternatively, when a logical-physical transformation having a high degree of freedom is used, the size of the logical-physical transformation table becomes enormous, and control costs increase. To solve for these problems, a method for using a specific area in the block 403 as an update data storage area, and/or a method for retaining a plurality of flash transformation layers (FTLs), which are flash memory control layers that include the logical-physical transformation table 306 (not shown in the drawing), and switching to the optimal FTL in accordance with the access type may be performed.

Figure 5:
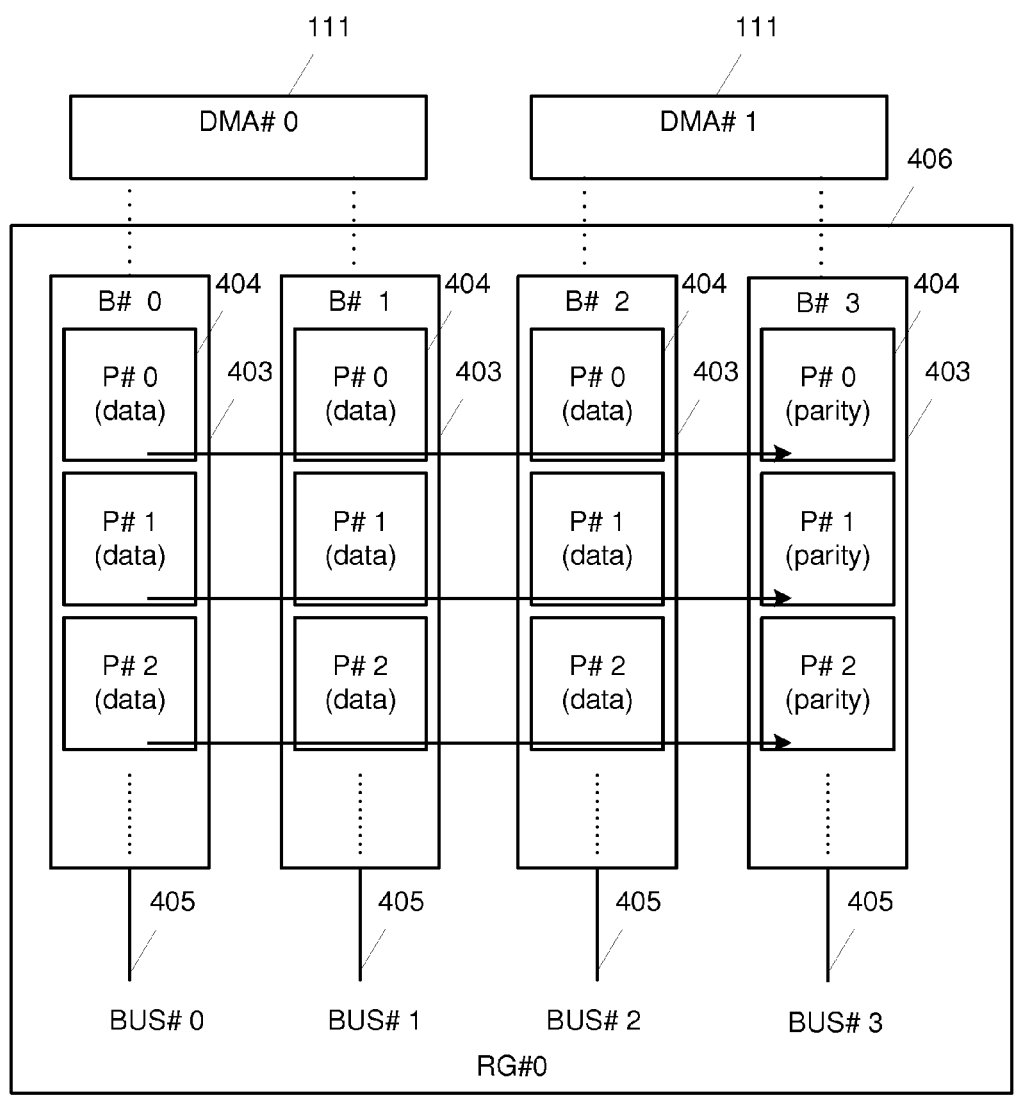
FIG. 5 is a drawing schematically showing a redundancy configuration of the flash memory storage apparatus 101.

FIG. 5 is a drawing schematically showing the redundancy configuration of the FMPKG 101.

As a method for providing a redundancy configuration, parity, which is redundancy data, may be created for a plurality of data elements as in RAID. A semiconductor storage device like the FMPKG 101 of this example is not a disk apparatus, but in this example, the method for creating parity in order to provide a redundancy configuration is called RAID for the sake of convenience. Also, in this example, a single unit having redundancy is called a RAID Group (RG).

In the case of a flash memory, it is conceivable for the RG configuration, for example, to be configured in units of FM chips 110, dies 401, and blocks 403, and an RG configuration that is in units of blocks 403, which is the smallest thereamong, is considered to be the best at dealing with sudden failures. An RG configured in block units will be explained below.

An RG #0 is configured from blocks #0 through #3 using 3D+1P. Specifically, for example, data is written in blocks #0, #1, and #2, and parity is written in block #3. Also, in this example, it is assumed that one stripe is configured in physical pages 404 having the same offset location in each block 403. In this example, the physical pages 404 having the same offset location in each block 403 are indicated using the same physical page number. Thus, a stripe is configured for each physical page number in the blocks #0 through #3. In this example, data and parity placement that is the same as the so-called RAID 4, in which parity is written to a specific block 403 inside one RG, is used.

In the case of a normal RAID configuration that uses HDD, when a portion of the data in a stripe is updated, the parity in the stripe must be updated. Thus, RAID 5, in which parity placement is distributed, is most often used so that access does not concentrate on a specific HDD. However, according to this example, when a portion of the data in a stripe is updated, parity is created by forming another stripe. Thus, the parity in the original stripe in which the updated data is included is not updated. The effect is that there is no need to distribute parity placement, and fixing parity placement makes address management easier.

Also, for example, data placement may be the same as in RAID 5 or RAID 6, which distribute parity placement. In this example, it is not necessary to update parity each time data is updated, and as such parity that has been written one time is basically not read. In a flash memory, a voltage must be applied to a cell when reading data, and the voltage also affects the periphery of the read-target cell causing a phenomenon (a read disturbance) whereby the data read becomes impossible. Thus, by rotating the parity placement as in a RAID 5, the pages storing the parity for which a read is not performed are arranged periodically, making it possible to reduce the affects of read disturbance. Reducing read disturbances has the effect of enhancing reliability.

In this example, the blocks configuring an RG can be selected arbitrarily. In a case where parity is placed as in a RAID 4 here, when the blocks storing the parity are concentrated in FM chips connected to a single bus, there will be buses that are seldom used in reads, and read performance will decline. Placing parity in a distributed manner as in a RAID 5 does away with specific blocks that are not used in reads, and a drop in read performance is curbed.

In the following explanation, a physical device unit that can be blocked by a failure in the FMPKG 101 is called a failure unit. The FM control apparatus 102 configures the RG 406 using a plurality of blocks 403 respectively belonging to a plurality of failure units. The failure unit may be a block 403, a die 401, an FM chip 110, a bus 405, or a DMA 111. In this example, it is assumed that the blocks #0 through #3 that comprise the RG #0 are each connected to a different bus #0 through #3. Thus, the blocks #0 through #3 each belong to a different die 401, and belong to different FM chips 110. Configuring the RG 406 in this manner makes it possible to heighten the likelihood of data restoration in response to a failure, and to increase the reliability of the FMPKG 101.

Also, by connecting each of the blocks #0 through #3 to a different bus 405, parallel processing is possible. Specifically, the FM control apparatus 102 can specify a drive-target FM chip 110 using a Chip Enable (CE) circuit not shown in the drawing. For example, in this example, buses #0 and #1 are connected to DMA #0, and buses #2 and #3 are connected to DMA #1, and, in addition, a plurality of FM chips 110 is connected in parallel to a single DMA 111 via the bus 405. When buses #0 and #1 are using a common CE, the DMA #0 can simultaneously write to two different physical pages 404 belonging to buses #0 and #1. Similarly, when buses #2 and #3 are using a common CE, the DMA #1 can simultaneously write to two different physical pages 404 belonging to buses #2 and #3. DMAs #0 and #1 can also simultaneously erase different blocks 403. An RG configuration that enables parallel operation like this makes it possible to enhance the performance of the FMPKG 101.

Figure 6:
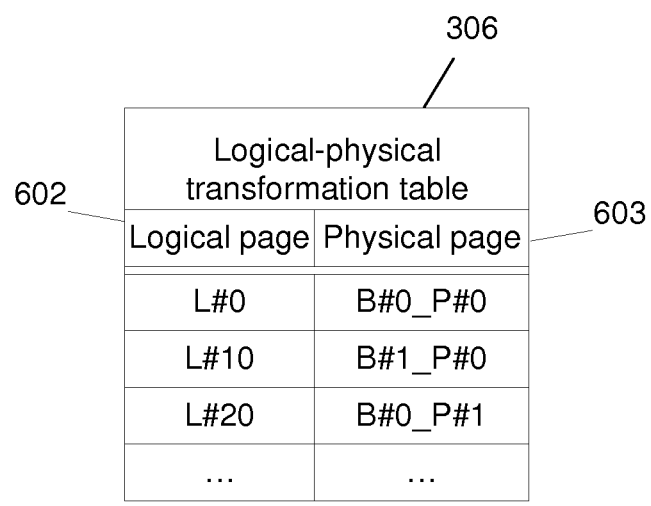
FIG. 6 shows an example of a logical-physical transformation table 306.

FIG. 6 shows an example of the logical-physical transformation table 306.

The logical-physical transformation table 306 comprises entries for associating a data storage-destination logical page 602 with a physical page 603. In the example of this drawing, a physical page (P #0 of B #0) is associated with a logical page L #1. The logical-physical transformation table 306, for example, is updated each time the association between a logical page and a physical page changes.

In this example, a case in which a logical page and a physical page are directly associated in accordance with the logical-physical transformation table 306 is explained, but the present invention is not limited thereto. A data storage location in a logical area and a data storage location in a physical area may be associated either directly or indirectly. The association of a logical area and a physical area need not be performed using this table 306 alone, and, for example, may go through another table as well. The sizes of the logical area and the physical area being associated may be the same or different.

Figure 7:
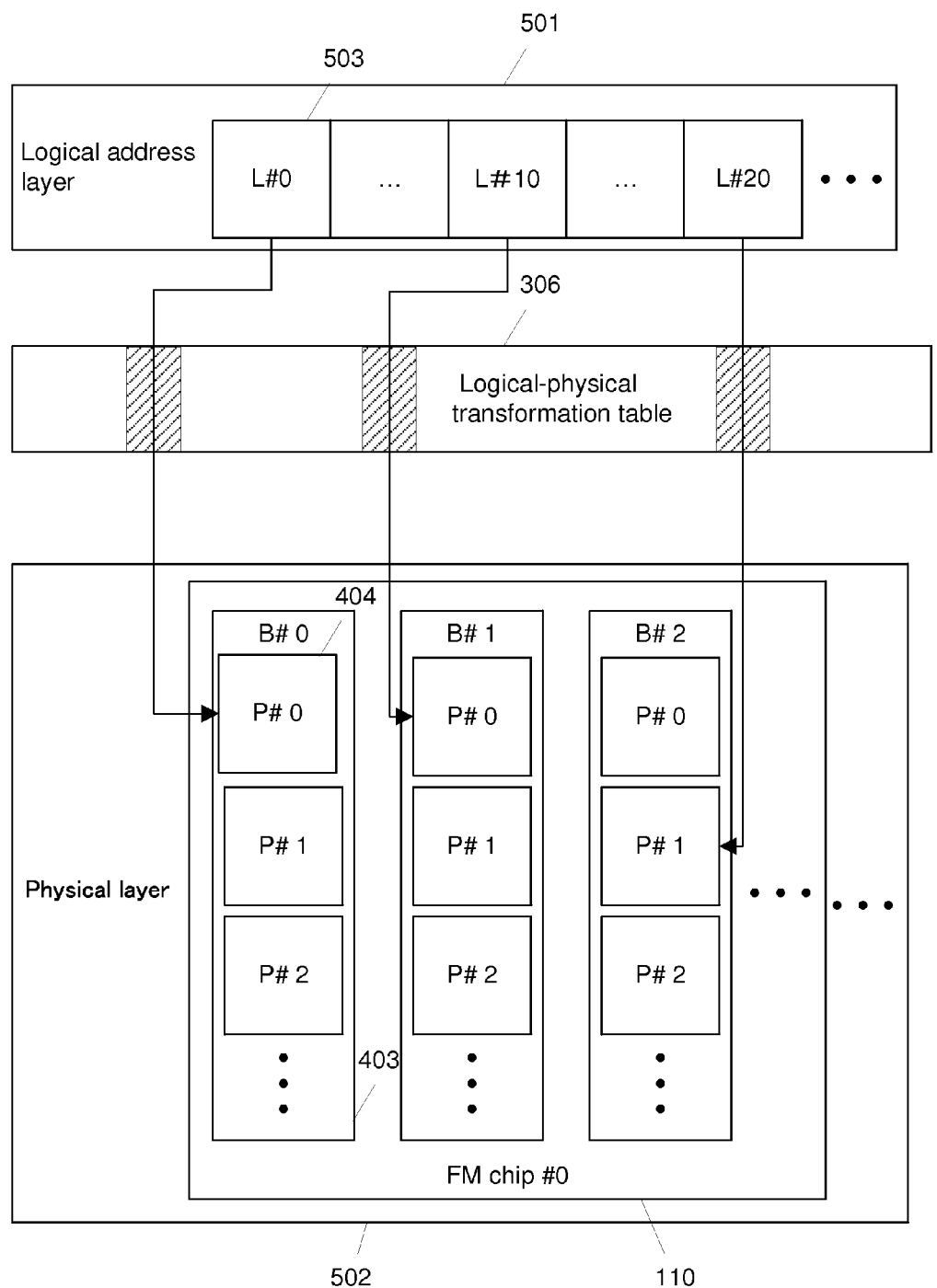
FIG. 7 shows an overview of a logical-physical transformation process.

FIG. 7 shows an overview of a logical-physical transformation process.

The logical-physical transformation process is performed in accordance with the CPU 107 executing the logical-physical transformation program 305 stored in the memory 108.

A logical address layer 501 represents a logical area provided to the higher-level apparatus by the FM control apparatus 102. In this example, the logical area in the logical address layer 501 is divided into a plurality of logical pages 503. Also, in this example, the size of a logical page 503 is the same as that of a physical page 404 of the FM chip 110. The size of a logical page 503, for example, is eight volume blocks. As used here, "volume blocks" are individual storage areas comprising a logical area provided to the higher-level apparatus, and, for example, correspond to one SCSI block.

A physical layer 502 represents a plurality of physical areas in an FM chip 110. In this example, a physical area in the physical layer 502 is divided into a plurality of physical pages 404. The logical-physical transformation program 305 associates a logical page 503 with a physical page 404, and stores the association in the logical-physical transformation table 306.

In this example, the logical page L #0 is associated with the page #0 in the block #0 of the FM chip #0. When a read request specifying the logical page #0 is received from the higher-level apparatus, the FM control apparatus 102, in accordance with the read request, reads data from the physical page #0 in the block #0 of the FM chip #0 on the basis of the logical-physical transformation table 306, and sends the data to the higher-level apparatus.

In this example, a logical page number is associated with a physical page number on the premise that the logical page 503 and the physical page 404 are the same size, but the present invention is not limited thereto. The logical page 503 and the physical page 404 may also be specified using the addresses thereof instead of either the logical page number or the physical page number. The logical address may be a logical block address (LBA).

When the size of the logical page 503 is smaller than that of the physical page 404, a corresponding physical page 404 is determined for each range smaller than the physical page size in the logical area. Specifically, for example, four volume blocks from logical address 0x00 to 0x03, and four volume blocks from logical address 0x04 to 0x07 may be written to different physical pages 404.

In contrast thereto, when the size of the logical page 503 is larger than that of the physical page 404, restrictions may be placed on the arrangement of the physical pages 404. Specifically, for example, the range of addresses for a single logical page 503 is from LBA 0x00 to 0x0f, and when the addresses are associated with two physical pages 404, the physical pages 404 may be a physical page group determined on the basis of a fixed rule, such as successive physical pages 404 in the same block 403. This is equivalent to using a virtually expanded physical page, and makes it possible to reduce the amount of data in the logical-physical transformation table 306.

FIG. 8 shows the RG management table 307.

The RG management table 307 is information for managing the RG 406. The RG management table 307 comprises an entry for each RG 406, and manages the status of each RG 406. Each entry comprises an RG number (RG #) 1102, a status 1103, a number of valid pages 1104, a next write location 1105, and a degradation level 1106.

The RG number 1102 is the identifier for an RG 406 in the FMPKG 101. The status 1103 indicates the status of the RG 406. For example, as the status 1103, there is "writable", "unused", "write-complete", and "erasable". In the case of "writable", the RG 406 has an empty page, and is in a state in which a data write is possible. In the case of "unused", the RG 406 is in a state in which erase processing was executed for a block 403, after which all of the physical pages 404 in the RG 406 are empty pages. In the case of "write-complete", the RG 406 is in a state in which writes have been executed for all the physical pages 404, and, in addition, at least one physical page 404 of the physical pages 404 in the RG 406 is associated with a logical page 503. In the case of "erasable", the state is such that the associations of all the physical pages 404 in the RG 406 with the logical pages 503 have been cleared, and an erase process is possible. In the following explanation, a physical page 404 that is associated with a logical page 503 may be referred to as a valid page, and a physical page 404 for which an association with a logical page 503 has been cleared may be referred to as an invalid page.

The number of valid pages 1104 indicates the number of valid pages in the RG 406. The number of valid pages 1104, for example, constitutes the criterion for determining whether or not the RG 406 is a target for reclamation. The next write location 1105 is a value indicating a write-destination start location for write data for the next write command to the RG 406. The next write location 1105 of this example indicates the physical page number of the next write destination. The next write location 1105 increases at each write. The next write location 1105 constitutes the decision criterion when deciding a write destination for an RG 406 with a status 1103 of "writable". The degradation level 1106 is the degradation level of the RG 406, and is used in determining a copy-destination RG 406 at the time of refresh or reclamation. The degradation level 1106, for example, is the average value of the degradation levels of a plurality of blocks 403 comprising the RG 406, but the present invention is not limited thereto, and the degradation level 1106 may be a minimal value or any other such value.

For example, the RG #0 is in the "writable" status and can be selected as a write destination. The RG #0 has a degradation level 1106 of "low" and is suitable for storing high-frequency write data. The alternatives for write-destination RGs 406 need not be numerous, and, for example, a few each of RGs 406 suited to high-frequency writes and RGs 406 suited to low-frequency writes may be prepared as write-destination RG 406 candidates.

FIG. 9 shows the block management table 308.

The block management table 308 is information for managing blocks 403. The block management table 308 comprises an entry for each block 403, and manages the affiliation of each block 403. Each entry comprises a block number (block #) 1202, an affiliated RG 1203, and a degradation level 1204.

The block number 1202 is a number for identifying a block 403. In this example, a block number 1202 is uniquely configured for all the blocks 403 in the FMPKG 101. The number, for example, is determined from the physical arrangement of the blocks 403, and alternatively, it is also possible to determine the physical location of a block 403 from the number thereof. Also, for example, the number may be configured irrespective of physical location, and the block number 1202 may also comprise information for managing the physical location of another block 403.

The affiliated RG 1203 indicates the number of the RG 406 to which the block 403 belongs. The degradation level 1204 indicates the degradation level of the block 403. The degradation level of the block 403 expresses the data retention characteristics of a cell, and, for example, is a number of erases, but the present invention is not limited thereto. The degradation level 1204 may be a value that reflects the number of past error detection and correction (ECC) bits, or a value that adds a temperature, a write frequency, or other such environmental and statistical information.

FIG. 10 shows the reverse-lookup management table 309.

The reverse-lookup management table 309 is the logical-physical transformation information for the RG 406. The reverse-lookup management table 309 manages the associations between logical pages 503 and physical pages 404 belonging to an RG 406 for each RG 406. Each entry comprises an RG number (RG #) 1302, a physical page 1303, and a logical page 1304.

The reverse-lookup management table 309, for example, is referred to when performing reclamation or refresh. In this example, a reclamation process and a refresh process are performed for the plurality of blocks 403 comprising an RG 406. Thus, this table 309, via which a logical-physical transformation table 306 reverse lookup is possible, is necessary in order to acquire the valid pages included in the target RG 406.

The RG number 1302 indicates the identifier of an RG 406. The physical page 1303 is the number for identifying a physical page 404 in a block 403 comprising the RG 406. In this example, the physical page 1303 indicates the page number together with the block number as in "P #0 of B #0", but any value may be used as long as it is possible to uniquely identify the physical page 404 in the RG 406. In the logical page 1304, there is configured a logical page 503 that is associated with a physical page 404. When there is no corresponding logical page, "unallocated" is configured.

The reverse-lookup management table 309 may be updated either at the time when a block 403 erase process is performed, or at the time when data is written to an erased physical page 404. This, for example, is because the logical-physical transformation table 306 is updated each time data is written, and because comparing the logical-physical transformation table 306 with the reverse-lookup management table 309 as needed makes it possible to distinguish that fact that a physical page 404 has been invalidated. Also, besides the reverse-lookup management table 309, the validity and/or invalidity of a physical page 404 may also be managed using a well-known method such as a bitmap. That is, when the data stored in a certain logical page 503 has been updated, bits in the physical page 404, which is associated with the logical page 503 and becomes an invalid page in accordance with the data update, are turned OFF. In accordance with this, it is not necessary to determine which physical pages 404 are either valid or invalid at the time of a reclamation process and a refresh process.

FIG. 11 shows an example of the RG configuration table 310.

The RG configuration table 310 is information for configuring an RG 406. The RG configuration table 310 comprises an entry for each RG 406, and manages the blocks 403 belonging to each RG 406. Each entry comprises an RG number (RG #) 1802, a block (0) 1803, a block (1) 1804, a block (2) 1805, and a block (3) 1806. For example, the RG #0 is configured from the four blocks 403 of "B #0", "B #10", "B #5", and "B #6". The RG 406, for example, is configured using a plurality of blocks 403 for which the failure unit differs and parallel processing is possible. Also, the RG configuration table 310, for example, is configured via the management terminal 202 by the administrator. In this example, data is stored in the blocks 403 inside a single RG 406, but whether parity is stored is not defined. The FM control apparatus 102 selects a plurality of arbitrary blocks 403 inside the FMPKG 101, and registers the blocks 403 in the RG configuration table 310 as an RG 406. The FM control apparatus 102 selects the blocks 403 from FM chips 110 connected to respectively different buses to make the RG. This is to avoid a situation in which it becomes impossible to recover data when a plurality of blocks 403 exist in an RG 406 on a specific bus and a failure occurs in the bus. Also, registering, as an RG 406, blocks 403 comprising RGs 406 from a plurality of buses makes it possible to operate the plurality of buses in parallel, and enhances read and write performance.

Figure 12:
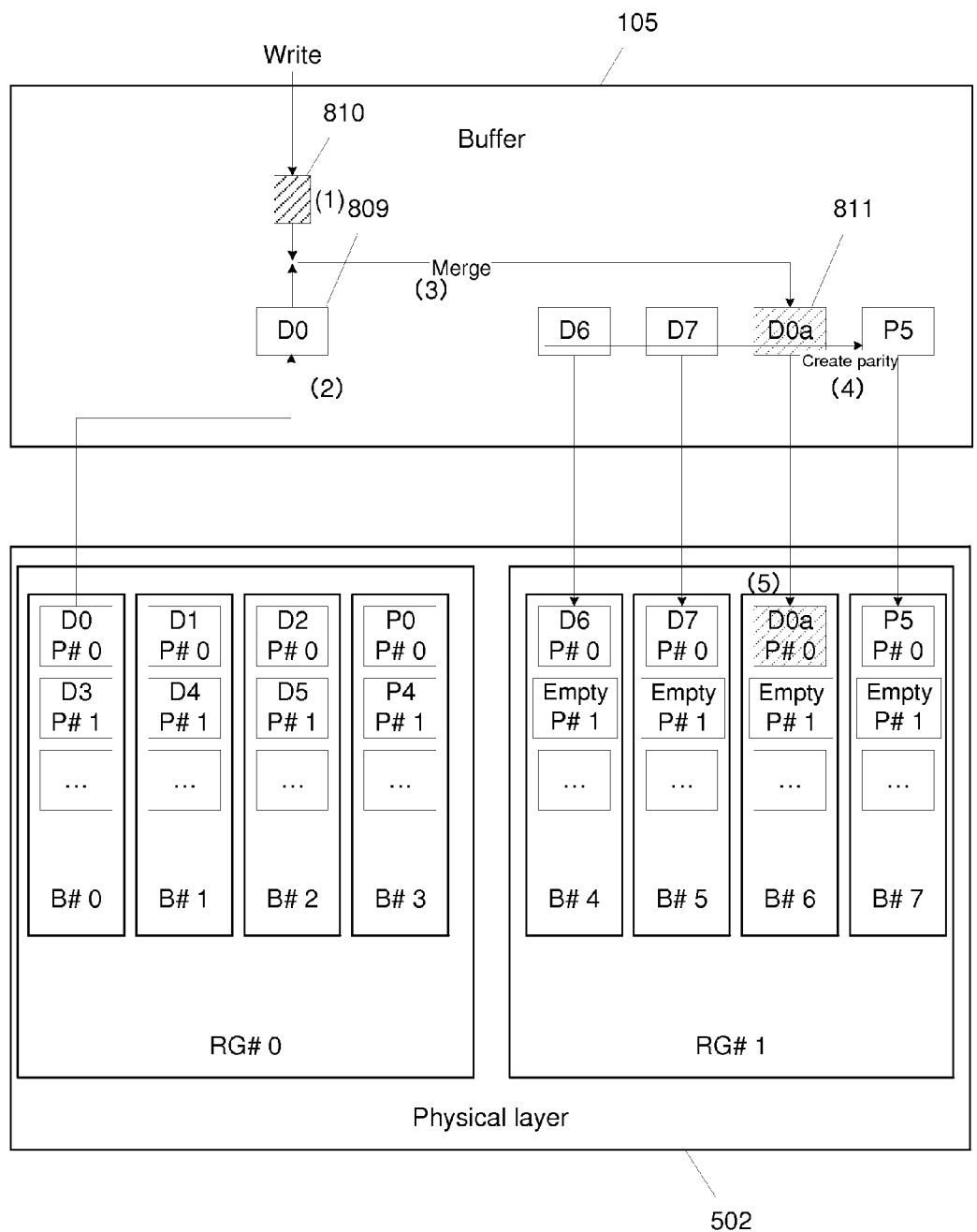
FIG. 12 is a drawing illustrating an overview of a data update process.

An overview of a data update process in this example will be explained below. FIG. 12 is a drawing for illustrating an overview of the data update process.

In the case of a normal RAID using a plurality of HDDs, when an RG comprises parity, the parity in the same stripe as the data being targeted for updating (referred to as target data in the explanation of this process) is updated when the data is updated. When this approach is applied as-is to a RAID in accordance with a plurality of blocks of flash memory, the update parity must be written to another physical area in addition to the update data. The increase in writes leads to the degradation of the flash memory. Thus, in this example, as will be explained hereinbelow, parity creation is carried out by forming another stripe for the update data.

The RG #0 is configured from the blocks B #0 through B #3. The blocks B #0 through B #2 are blocks for storing data, and the block B #3 is a block for storing parity. Physical pages having the same physical page number in the different blocks B #0 through B #3 comprise a single stripe. For example, P #0 of B #0, P #0 of B #1, P #0 of B #2, and P #0 of B #3 comprise a single stripe.

In the data update process, the FM control apparatus 102 stores write data 810 received from the higher-level apparatus in the buffer 105 (1). Then, the FM control apparatus 102 reads the target data D0 of the physical page (P #0 of B #0 in RG #0) corresponding to the logical page specified by the higher-level apparatus into a storage location 809 in the buffer 105 (2). The FM control apparatus 102 makes the physical page (P #0 of B #0 in RG #0) an invalid page. It is assumed here that the write data 810 is smaller in size than the target data D0. Thus, the FM control apparatus 102 merges the write data 810 with the target data D0, and stores the merged data D0a in a storage location 811 in the buffer 105 (3). The read target data storage location 809 in the buffer 105 may be the same as the merged data D0a storage location 811.

The FM control apparatus 102 creates parity P5 using the merged data D0a and other data D6 and D7 stored in the buffer 105 (4). The data D6 and D7 here, for example, are either write data (including merged data) based on a write request from the higher-level apparatus, or data (restored data) obtained by restoring data constituting a read error (error data) at the time of a read request from the higher-level apparatus. The FM control apparatus 102 configures the data D6, D7, and D0a, and the parity P5 as a new stripe, and stores the data and parity in corresponding locations (P #0 of B #4, P #0 of B #5, P #0 of B #6, and P #0 of B #7) in accordance with the next write location 1105 of the write-destination RG #1 (5). In this example, the write-destination RG #1 is a different RG from the RG #0 in which the target data D0 is stored, but may be the same RG 406. In this example, using a different RG 406 makes it possible to select an appropriate RG 406 as the write destination. For example, in this example, the write-destination RG #1 is determined on the basis of the write frequency of the write data, that is, the write frequency of the logical page specified by the higher-level apparatus. Viewed from the standpoint of wear leveling, it is preferable that a block having a low degradation level be selected for data having a high write frequency. For example, the FM control apparatus 102 may comprise information for managing the write frequency of each logical page 503. Also, write frequency information is not limited to a logical page 503, and may be managed for each LBA and/or an area wider than a logical page 503. In addition, the write-destination RG may be determined by I/O type. The I/O type, for example, is identified as either a write based on a write request from the higher-level apparatus, or as a write (copy) based on either a reclamation process or a refresh process. The latter may have a lower write frequency than the former.

In an RG 406 of this example, a stripe was made up of three pieces of data and one parity (3D+1P), but the present invention is not limited thereto. A stripe may comprise two or more parities.

Figure 13:
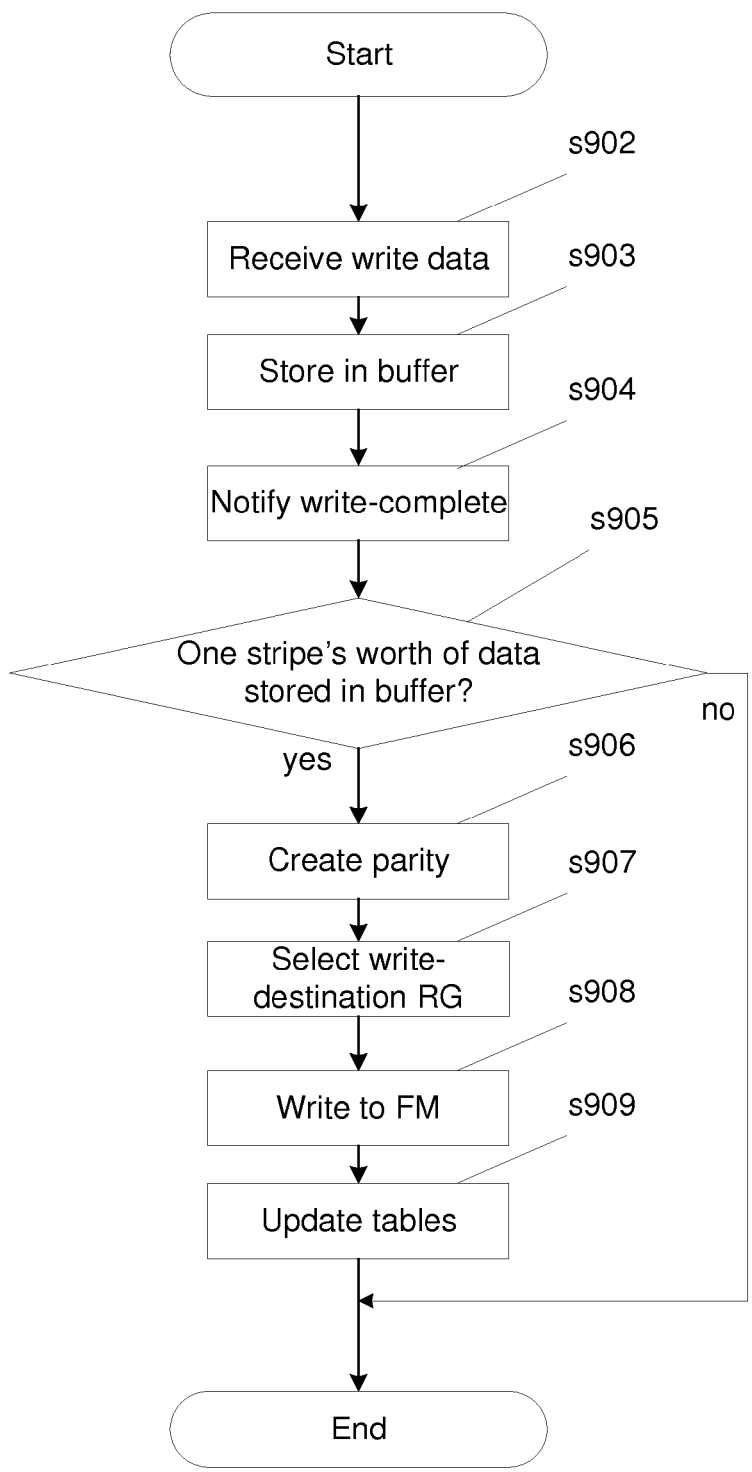
FIG. 13 is a flowchart of a data update process.

FIG. 13 is a flowchart of a data update process.

The data update process is executed in accordance with the CPU 107 of the FM control apparatus 102 booting up the data update processing program 311. A case in which the write data is the same size as the target data and transitions to update data as-is will be explained below.

The FM control apparatus 102 boots up the program 311 upon receiving a write request from the higher-level apparatus (S902).

In Step S903, the program 311 stores write data associated with the write request from the higher-level apparatus in the buffer. In so doing, the program 311, on the basis of the logical-physical transformation table 306, identifies and sets as the target pages the physical pages 404 corresponding to the write-destination logical pages 503 specified by the write request, makes the target pages invalid pages, and in the RG management table 307, reduces the number of valid pages of the RGs 406 to which the target pages belong by the number of target pages that were made invalid.

In Step S904, the program 311 sends a write-complete notification to the higher-level apparatus.

In Step S905, the program 311 determines whether or not one stripe's worth of data is stored in the buffer 105. The data may be stored on the buffer 105 in a continuous manner, or may be partitioned and managed in a plurality of segments using cache control. When the determination result is true (S905: Yes), the program 311 advances the processing to Step S906. Alternatively, when the determination result is false (S905: No), the program 311 ends the processing.

In Step S906, the program 311 creates parity on the basis of the one stripe's worth of data stored in the buffer 105.

In Step S907, the program 311 selects an RG 406 of the write-destination as the write-destination RG.

In Step S908, the program 311 writes the one stripe's worth of data stored in the buffer 105 and the parity to the physical pages 404 of the blocks 403 in the write-destination RG.

In Step S909, the program 311 updates the logical-physical transformation table 306 and the RG management table 307. Specifically, for example, regarding the logical-physical transformation table 306, the program 311 associates the physical pages 404, which are the written data storage destinations, with the respective logical pages 503 so as to make the physical pages 404 valid pages, and clears the associations with the logical pages 503 so as to make the target pages invalid pages. Also, the program 311 updates the number of valid pages 1104 and the next write location 1105 of the write-destination RG in the RG management table 307. Also, when the next write location 1105 reaches the end of the RG 406, the program 311 sets the status 1103 of the RG 406 to "write-complete".

In the above-described process, updated parity need not be written to an empty page every time data is updated, thereby making it possible to reduce the amount of writes. When there is a write request (update request) for a data update from the higher-level apparatus, a conventional flash memory storage apparatus must read the target data and the parity of the stripe to which the target data belongs (target parity) to a buffer, create updated parity from the target data, the target parity, and the updated data, and write the updated data and the updated parity to an empty page. Thus, for example, in the case of 3D+1P, the updated parity, which is created each time data is updated, has to be written three times in response to the update request for the three pieces of data. However, since the FMPKG 101 of this example configures a new stripe for the target data with other data on the buffer 105, it is not necessary to write the updated parity to an empty page for each data update. For example, in the case of the 3D+1P, a parity write may be performed one time in response to an update request for the three pieces of data, thereby making it possible to maintain the reliability of the data using the parity and to greatly reduce the amount of writes. This effect is even greater the larger the number of pieces of data comprising the group, for example, 15D+1P or the like. Since a stripe is configured in page units, throughput is also reduced.

In accordance with updating the logical-physical transformation table 306, the associations of the physical pages 404 in which the target data is stored with the logical pages 503 is cleared, and the physical pages 404 become invalid pages. However, the stripe to which the target data belongs is maintained without erasing the target data until either a reclamation process or a refresh process is performed for the RG 406. Thus, for example, error data restoration is possible even when a read error has occurred in any of the data belonging to the stripe.

This example configures a stripe using physical pages rather than logical pages. Specifically, parity is created from one stripe's worth of data in the order in which the data was stored in the buffer regardless of the storage locations of the target data, and the data and the parity are written to empty pages to configure the stripe. Thus, flexibility is enabled even in an FMPKG 101 for which data rewriting is not possible.

The data update process of this example is premised on so-called write back (write after), in which after receiving a write request from the higher-level apparatus and storing the write data in the buffer 105, a write-complete notification is immediately sent to the higher-level apparatus. The data update process is efficient because the parity is created and the data and parity are written to the physical pages 404 after storing one stripe's worth of data in the buffer 105. As a variation, the data update process may be premised on so-called write through, in which the write-complete notification is sent to the higher-level apparatus after the write data has been written to the physical pages 404. In this case, the data update processing program 311 does not create the parity after one stripe's worth of data has been stored in the buffer 105, but rather creates parity (referred to as intermediate parity hereinafter) up to the time point when the write data was received, stores only the intermediate parity in the buffer 105, and writes the write data to the physical pages 404. Then, upon receiving the next write data, creates new intermediate parity on the basis of the write data thereof and the intermediate parity. A data update process premised on write through creates intermediate parity like this each time write data is received, ultimately creates parity (final parity) on the basis of one stripe's worth of data, and writes the final parity to a physical page 404. For example, in accordance with using a data update process that is premised on write through, the write data is written to the physical pages 404 sequentially, thereby making it possible to restore the intermediate parity from the data that has been written to the physical pages 404 even when the FMPKG 101 does not have a battery 106 and power is not being supplied to the FM control apparatus 102.

The reclamation process and the refresh process in this example will be explained next. In this example, the reclamation process and the refresh process are executed for each RG 406.

Figure 14:
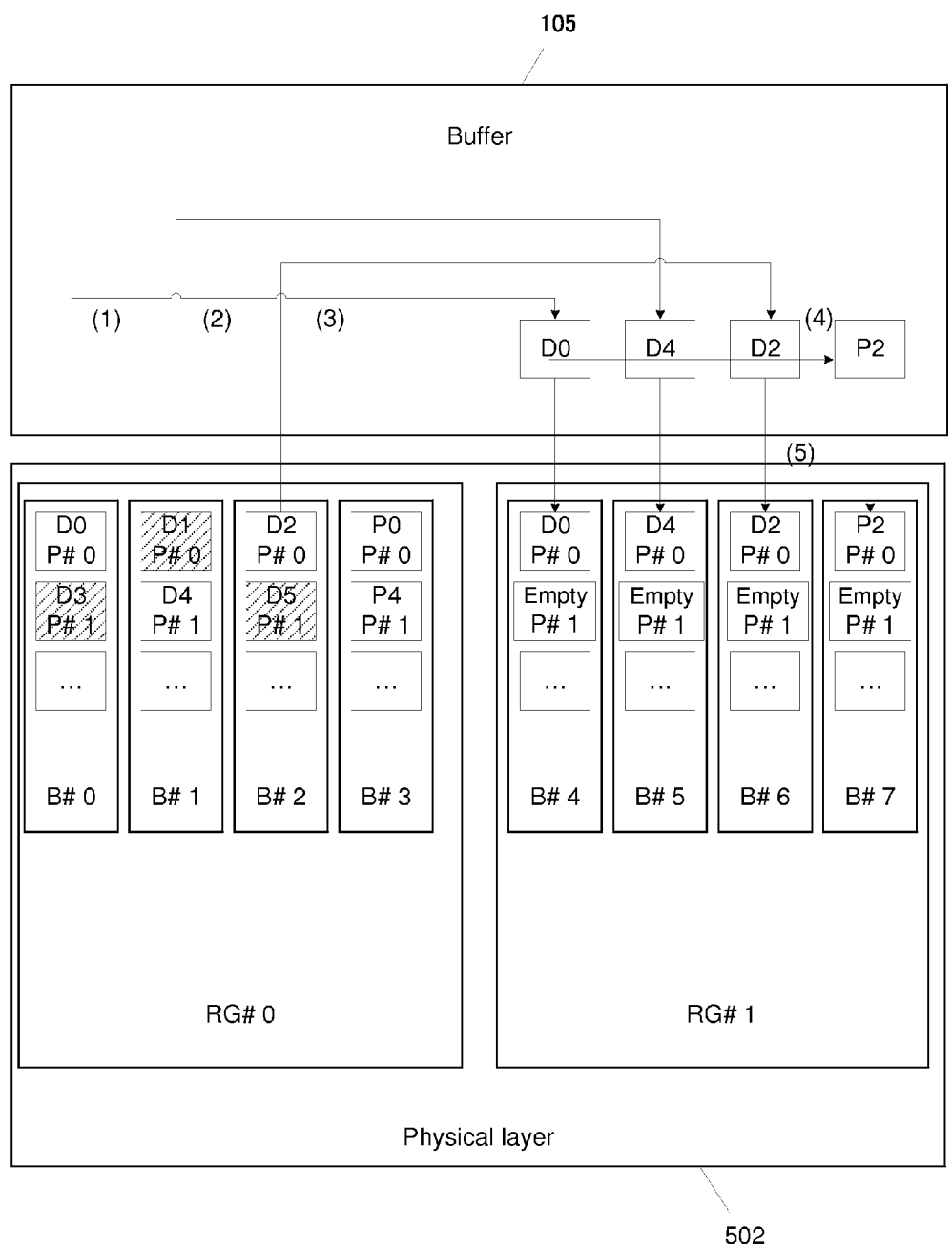
FIG. 14 is a drawing illustrating overviews of a reclamation process and a refresh process.

FIG. 14 is a drawing illustrating an overview of the reclamation process and the refresh process. The reclamation process will be explained hereinbelow, but fundamentally the same processing is also performed for the refresh process. In the drawing, the physical pages 404 indicated using hatching are invalid pages, the physical pages 404 in which "empty" is written are empty pages, and the other physical pages 404 are valid pages. Also, D0, D1, . . . in the physical pages 404 indicate data that is being stored in the physical pages 404, and P0, P2, . . . in the physical pages 404 indicate parity that is being stored in the physical pages 404.

First, the FM control apparatus 102 acquires a target RG #0 that will be the target of the reclamation process, and a copy-destination RG #1. Then, the FM control apparatus 102 reads all the valid data D0, D4, D2 in the target RG #0 to the buffer 105 ((1) through (3)). The FM control apparatus 102 configures a new stripe by creating parity P2 on the basis of the valid data D0, D4, D2 that was read (4), and writes the valid data D0, D4, D2 and the parity P2 of the new stripe to empty pages in the copy-source RG #1.

The valid data D0, D4, D2 and the parity P2 of the stripe are each written to an empty page P #0 having the same offset location in different blocks B #4, #5, #6 and #7 of the copy-destination RG #1.

Figure 15:
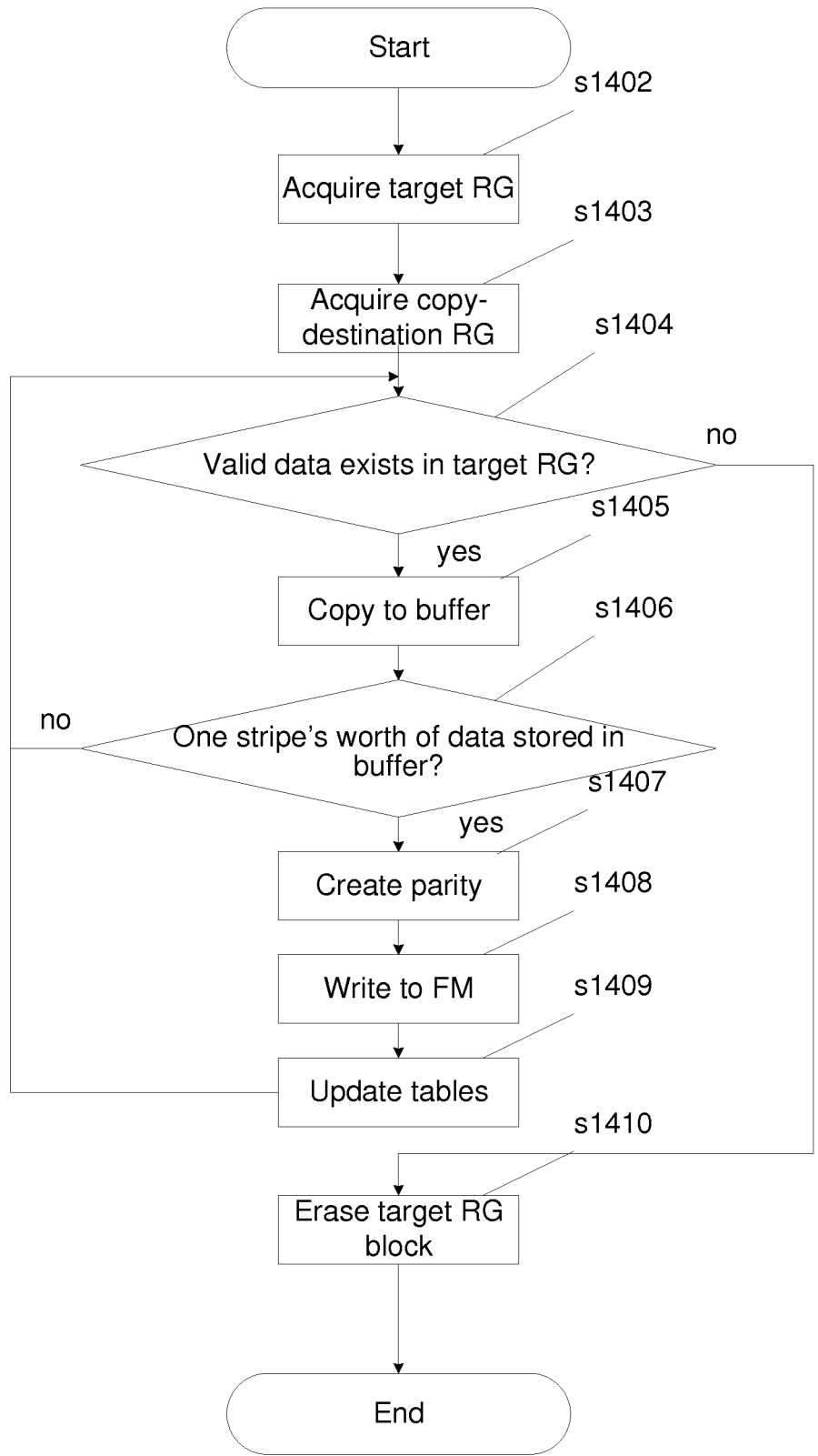
FIG. 15 is a flowchart of either a reclamation process or a refresh process.

FIG. 15 is a flowchart of either the reclamation process or the refresh process.

The reclamation process or the refresh process is executed in accordance with the CPU 107 of the FM control apparatus 102 booting up the reclamation processing/refresh processing program 312.

In Step S1402, the program 312 refers to the RG management table 307, and selects an RG 406 that will become the target of the processing as the target RG. For example, in the case of the reclamation process, the program 312 selects the RG 406 having the smallest number of valid pages 1104 from among the RGs 406 with a status 1103 of "write-complete". In the refresh process, the program 312 selects the RG 406 having a degradation level 1106 of "high" from among the RGs 406 with a status 1103 of either "erasable" or "write-complete". The FM control apparatus 102 may manage data retention period information for the RGs 406. In accordance with this, the program 312 may select an RG 406 having a long data retention period, or may select an RG 406 with a long data retention period relative to the degradation level. Because the period for which data can be maintained becomes short when the degradation level is high, for example, the program 312 determines a data retention period threshold such that the threshold becomes smaller the larger the degradation level of the RG 406, and selects the RG 406 for which the data retention period exceeds the threshold.

In Step S1403, the program 312 refers to the RG management table 307, and selects an RG 406 of the copy destination as the copy-destination RG. For example, as the copy-destination RG, an RG 406 having a degradation level 1108 of "low" is selected from among the RGs 406 with a status 1103 of either "unused" or "writable". The selection is based on the point of view of wear leveling.

In Step S1404, the program 312 determines whether or not valid data exists in the target RG. Specifically, the program 312 refers to the RG management table 307, and determines whether the number of valid pages 1104 for the target RG is not "0". When valid data exists (S1405: Yes), the program 312 advances the processing to Step S1410. Alternatively, when valid data does not exist (S1405: No), the program 312 advances the processing to Step S1406.

In Step S1405, the program 312 refers to the reverse-lookup management table 309, selects valid pages one at a time from the physical pages (that is, valid pages) corresponding to the logical pages 1304 allocated to the target RG, and reads the data (valid data) stored in the valid pages to the buffer 105.

In Step S1406, the program 312 determines whether or not one stripe's worth of data is stored in the buffer 105. The data may be stored on the buffer in a continuous manner, or may be partitioned and managed in a plurality of segments using cache control. When the determination result is true (S1406: Yes), the program 312 advances the processing to Step S1407. Alternatively, when the determination result is false (S1406: No), the program 312 returns the processing to Step S1404.

In Step S1407, the program 312 creates parity on the basis of one stripe's worth of data stored in the buffer 105.

In Step S1408, the program 312 writes one stripe's worth of data stored in the buffer 105 and the parity to respective blocks 403 of the copy-destination RG.

In Step S1409, the program 312 updates the logical-physical transformation table 306, the RG management table 307, and the reverse-lookup management table 309. For example, for the logical-physical transformation table 306 and the reverse-lookup management table 309, the program 312 associates the write-destination pages in the copy-destination RG to the logical pages allocated to the target RG and clears the association with the respective logical pages so as to make the valid pages in the target RG invalid pages. For the RG management table 307, the program 312 updates the number of valid pages 1104 and the next write location 1105 for the write-target RG 406.

In Step S1410, the program 312 executes an erase process for the target RG. For example, the erase process is performed for each block. The program sets the status 1103 of the target RG to "unused" in the RG management table 307. The program need not execute the target RG erase process in this step, but rather may set the status 1103 to "erasable" in the RG management table 307 and perform the erase process for the target RG any time thereafter.

The reclamation process and the refresh process read the data of valid pages from the target RG to the buffer 105, create parity with one stripe's worth of data stored in the buffer 105, and write the data and the parity to empty pages to configure a stripe. Thus, it is possible to manage the RGs in a flexible manner even for an FMPKG 101 for which data rewriting is not possible.

The FM control apparatus 102, by performing the reclamation process and the refresh process in RG units, is able to maintain all the stripes in the RG 406 even when a stripe includes an invalid page. Thus, for example, error data restoration is possible even when a read error has occurred for data belonging to any stripe in the RG 406.

In the reclamation process and refresh process described hereinabove, a method similar to that of the data update process for creating parity after one stripe's worth of data has been stored in the buffer 105, and writing the data and the parity to a copy-destination RG 406 was explained. However, similar to the variation of the data update process, a method for creating an intermediate parity each time data is stored in the buffer without storing one stripe's worth of data in the buffer, and writing the data to the physical pages 404 may also be employed.

Figure 16:
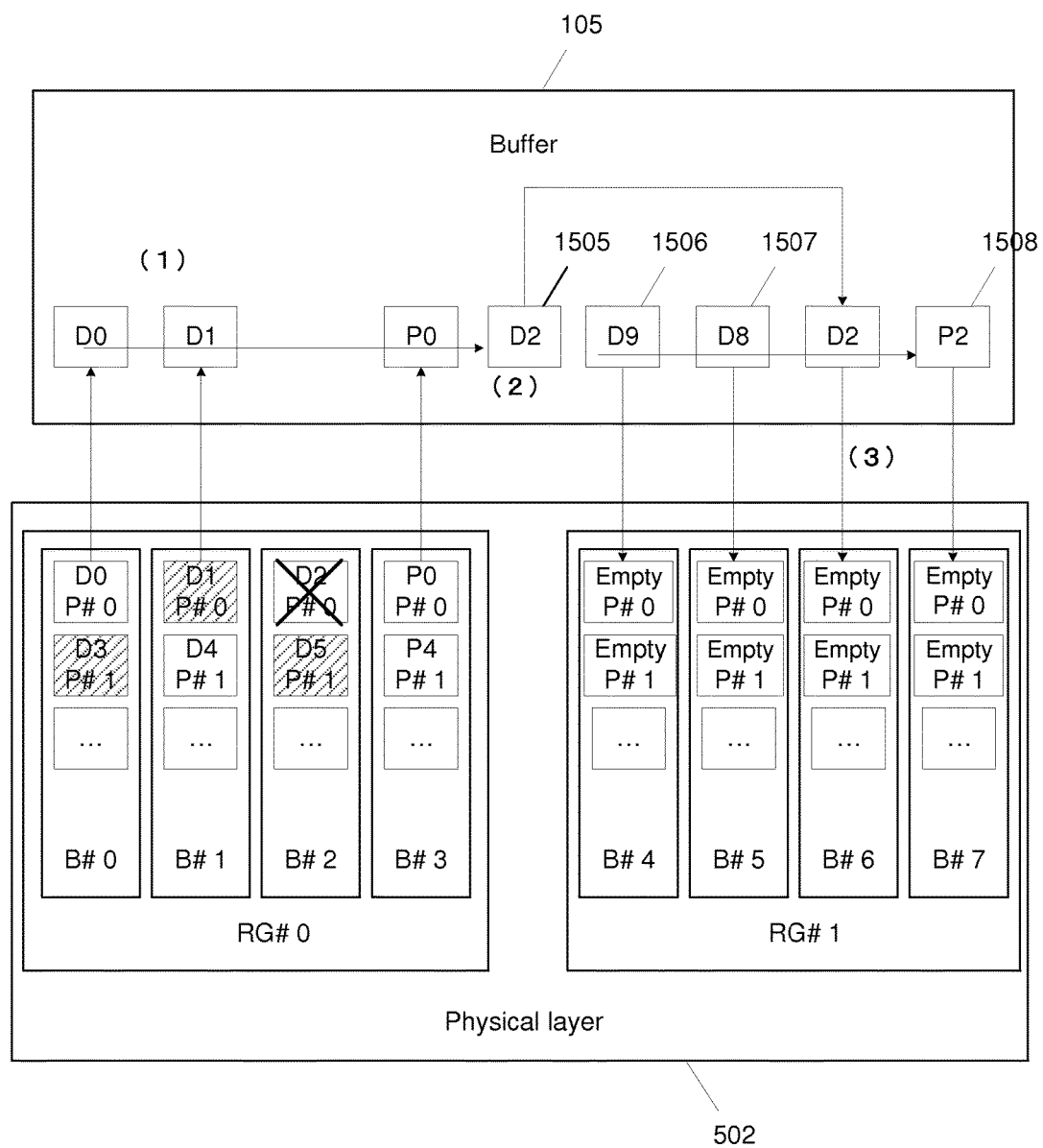
FIG. 16 is a drawing illustrating an overview of a correction process.

A correction process for when a read error has occurred will be explained next. FIG. 16 is a drawing illustrating an overview of the correction process.

The correction process is for restoring error data resulting from a read error either when there is a read error in response to a read request from the higher-level apparatus, or when there is a read error at the time of either the reclamation process or the refresh process. A read error is detected, for example, when there is an error response to the FM chip 110 with respect to a read command specifying a read-target physical page (read-target page) for the FM chip 110, or when there is no fixed time response.

A case in which the FM control apparatus 102 assumes that a read error has been detected with respect to a read command specifying a read-target page (P #0 of B #2 in RG #0), and restores the error data D2 in a correction process will be explained below.

The FM control apparatus 102 selects the storage-destination RG #0 of the error data D2 and the write-destination RG #1. Then, the FM control apparatus 102 acquires the other data and parity, which is needed to restore the error data, from the stripe to which the error data belongs (1). The acquired data and parity (D0, D1, P0) are respectively stored in P #0 of B #0, P#1 of B #1, and P #0 of B #3. At this time, the FM control apparatus 102 reads the data from the physical pages 404 regardless of whether the physical page 404 in the stripe is a valid page or an invalid page. In this example, valid data D0, invalid data D1, and parity P0 are acquired. Then, the error data D2 is restored on the basis of the data D0, D1, P0. The FM control apparatus 102 writes the data D0, D1, D2 and the parity P0 to the empty pages P #0 of B #4, P #0 of B #5, P #0 of B #6, and P #0 of B #7 of the write-destination RG #1.

Figure 17:
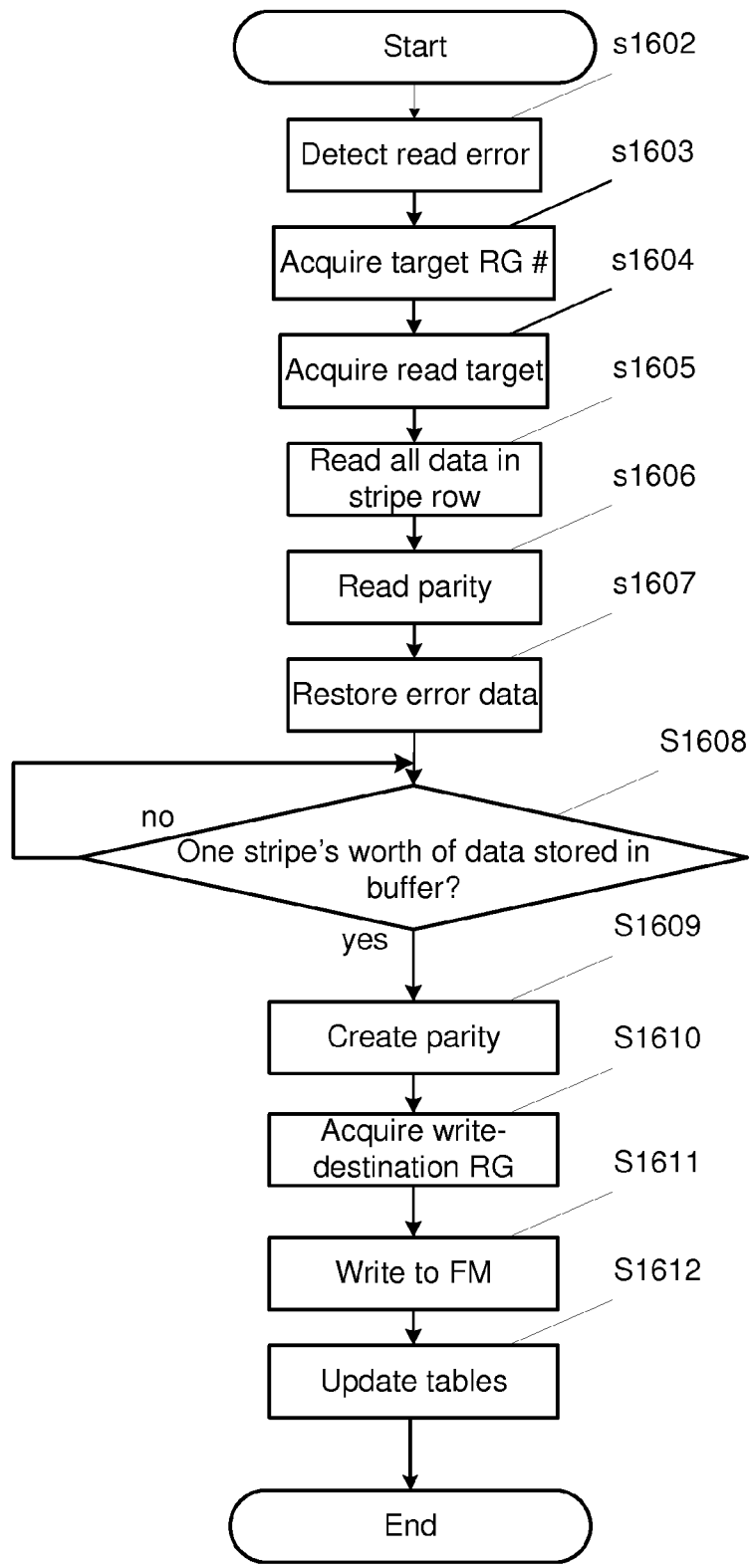
FIG. 17 is a flowchart of a correction process.

FIG. 17 is a flowchart of the correction process.

The correction process is executed in accordance with the CPU 107 of the FM control apparatus 102 booting up the correction processing program 313.

The program 313 is booted up when a read error has been detected for a read command specifying a read-target page (S1602).

In Step S1603, the program 313 acquires the RG # of the RG 406 in which the read error was detected. For example, the program 313 refers to the block management table 308, and acquires the RG number for the RG in which exists the physical page (referred to as error page in this explanation) specified by the read command for which the read error was detected.

In Step S1604, the program 313 refers to the RG configuration table 310, and acquires all the physical page numbers of the physical pages in which the other data and the parity of the stripe (referred to as target stripe in this explanation) that includes the error page.

In Step S1605, the program 313 specifies the RG number and the physical page numbers respectively acquired in S1603 and S1604, and reads the data in the acquired physical pages into the buffer 105. The specified physical page data is read regardless of whether it is valid data or invalid data.

In Step S1606, the program 313 reads the parity of the target stripe.

In Step S1607, the program 313 restores the error data from the data and the parity read in S1605 and S1606. Then, the program 313 stores the restored error data (restored data in this explanation) in the buffer 105.

In Step S1608, the program 313 determines whether or not one stripe's worth of data including the restored data is stored in the buffer 105. The data may be stored in a continuous manner on the buffer 105, or may be partitioned and managed in a plurality of segments using cache control. The data may include other write data. When the determination result is true (S1608: Yes), the program 313 advances the processing to Step S1609. Alternatively, when the determination result is false (S1608: No), the program 313 returns the processing to S1608.

In Step S1609, the program 313 creates parity on the basis of the one stripe's worth of data stored in the buffer 105, which includes the restored data.

In Step S1609, the program 313 selects an RG 406 of the write destination as the write-destination RG. For example, the program 313 determines the write-destination RG on the basis of the write frequency of the write data, the I/O type, and so forth just like in the data update process.

In Step S1610, the program 313 writes the one stripe's worth of data stored in the buffer 105 to the write-destination RG.

In Step S1611, the program 313 updates the logical-physical transformation table 306 and the RG management table 307. For example, the program 313 associates the physical pages that are the storage destinations for the written data with the respective logical pages so as to make the physical pages 404 valid pages, and clears the associations with the logical pages so as to make the physical pages that are the storage destinations of the error data invalid pages. Also, the program 313 updates the number of valid pages 1104 and the next write location 1105 of the write-destination RG in the RG management table 307.

As described above, it is possible to restore error data even when a read error has occurred in any piece of data, and to store the restored data in another location while maintaining the redundancy as-is.

After the correction process is complete, the FM control apparatus 102, based on the fact that an error occurred, may execute the above-mentioned reclamation process for the target RG.

In the above-described correction process, parity is created using the restored data and other data stored in the buffer 105, and the data and the parity are written to physical pages to configure a single stripe. However, the data that is read for restoring the error data, the restored data, and the parity may be written to the write-destination RG as a single stripe.

The correction process, for example, is performed at the time of a read error with respect to a read command from the FM control apparatus 102 based on a read request from the higher-level apparatus, a read error in update-target data for creating merge data on the basis of a write request at the time of a data update process, and a read error from the target RG at the time of reclamation/refresh processing.

Figure 18:
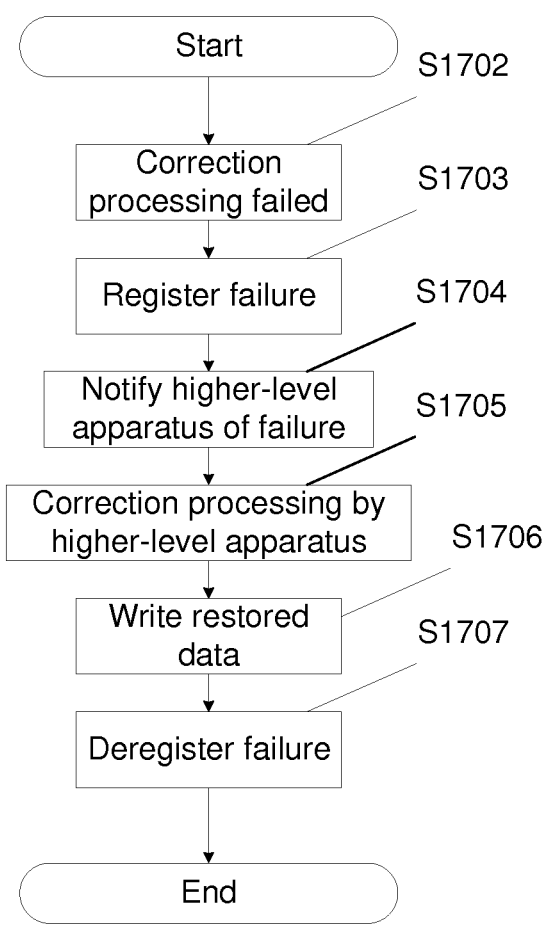
FIG. 18 is a flowchart of a recovery process.

A recovery process will be explained next. FIG. 18 is a flowchart of a recovery process. The recovery process, for example, is executed by the FMPKG 101 and the storage controller 204 when a correction process by the FMPKG 101 has failed. The FMPKG 101 for which the correction process failed is called an error FMPKG. The storage controller 204 configures a RAID, other than the RAID inside the error FMPKG, using a plurality of FMPKGs 101 including the error FMPKG. In the explanation that follows, the storage controller 204 RAID is called a higher-level RAID. The recovery process is performed in accordance with the CPU 107 of the FM control apparatus 102 in the error FMPKG executing a recovery processing program 314 stored in the memory 108, and the CPU 207 of the storage controller 204 executing a recovery processing program stored in the memory 208.

The recovery process starts when the FM control apparatus 102 in the error FMPKG detects a correction process error (S1702). For example, the correction process results in an error when a read error occurs due to a read other than that of an error page during correction processing.

In Step S1703, the FM control apparatus 102 in the error FMPKG registers a correction process error (correction error). At this point, the FM control apparatus 102 in the error FMPKG registers information enabling the identification of the storage-destination block (target block) for the error data. For example, the FM control apparatus 102 in the error FMPKG may register the fact that there was a correction error by associating the correction error with the target block in the block management table 308.

In Step S1704, the FM control apparatus 102 in the error FMPKG notifies the storage controller 204 of the correction error.

In Step S1705, the storage controller 204 receives a correction error notification from the FM control apparatus 102 of the error FMPKG. Then, the storage controller 204 executes a higher-level correction process using the plurality of FMPKGs 101 comprising the higher-level RAID. The higher-level correction process in the storage controller 204 at this point, for example, sends a read request for the one stripe's worth of data to which the error data belongs and the parity to the FMPKGs 101 other than the error FMPKG among the plurality of FMPKGs 101 comprising the higher-level RAID, and creates error data restoration data from the data and parity received from the FM control apparatus 102.

In Step S1706, the storage controller 204 sends a write request for the restoration data to the FM control apparatus 102 of the error FMPKG. Then, the FM control apparatus 102 that receives this write request stores the restoration data in the buffer 105. Then, when one stripe's worth of data is stored in the buffer 105, the FM control apparatus 102 creates parity and writes one stripe's worth of data including the restoration data and the parity to a write-destination RG. The write-destination RG is selected the same as in the correction process.

In Step S1707, the FM control apparatus 102 of the error FMPKG deregisters the correction error.

According to the above-described processing, for example, the storage controller 204 can restore error data even when an FMPKG 101 fails during a correction process.

Furthermore, the correction error notification performed in S1704, for example, is a case in which a correction error occurred with respect to a read request from the storage controller 204. When a correction error caused by something else occurs, for example, the FM control apparatus 102 asynchronously notifies of the correction error with respect to an I/O request from the storage controller 204. For example, the FM control apparatus 102 issues a notification regarding the correction error in accordance with polling from the storage controller 204. When the correction error notification is made asynchronously, the processing after S1705 is performed subsequent to the notification.

Example 2

A second example will be explained next. In the following explanation, the explanation will focus on the differences with the first example. Therefore, explanations of the same configurations and processes as the first example may be either simplified or omitted.

This example dynamically changes the configuration of the blocks 403 in an RG 406. In the first example, the configuration of the blocks 403 was fixed in the RG 406. However, when the blocks configuring the RG 406 are fixed and a failure occurs in one of the blocks 403 in the RG 406, there is a danger of the entire RG 406 becoming unusable. This example takes this problem in account and dynamically changes the configuration of the blocks 403 in the RG 406.

Figure 19:
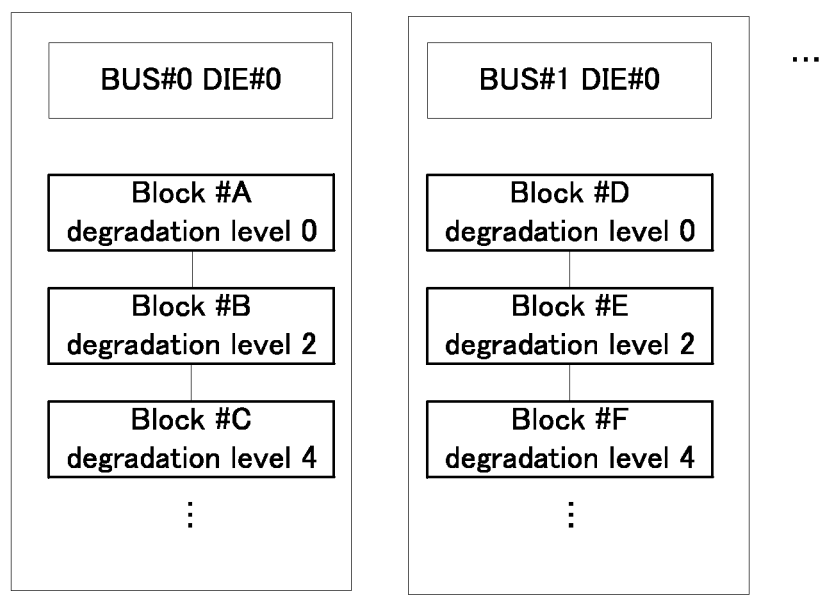
FIG. 19 schematically shows empty block management information.

FIG. 19 schematically shows empty block management information.

Empty block management information for managing an empty block is stored in the memory 108. The empty block management information comprises a list of empty blocks for each failure unit. Each entry in the list stores the number of the empty block and the empty block degradation level. It is assumed that the failure unit here is the bus 405. In the example of this drawing, it is assumed that blocks #A, #B, and #C belong to die #0 that belongs to bus #0, and that blocks #D, #E, and #F belong to die #0 that belongs to bus #1.

In the list for each failure unit of the empty block management information, the empty blocks are sorted in ascending order of degradation level. The FM control apparatus 102 of this example dynamically creates the RG configuration table 310 based on the empty block management information. By comprising the empty block management information, the FM control apparatus 102 is able to efficiently allocate empty blocks to the RG 406. Also, due to individual differences in block degradation levels resulting from inherent factors and stored data, there is potential for bias in the block 403 degradation levels in the RG 406 when the blocks 403 are allocated in a fixed manner to the RG 406. Because the FM control apparatus 102 in this example is able to dynamically change the blocks 403 configuring the RG 406, block 403 degradation level bias in the RG 406 can be prevented.

Empty blocks may be managed in a queue or the like on the basis of degradation level and/or failure unit.

FIG. 20 shows an example of a method for configuring the RG 406.

RG #0 is configured using blocks 403 having low degradation levels. RG #1 is configured using blocks 403 having high degradation levels. For example, storing high-frequency data in RG #0 and storing low-frequency data in RG #1 makes it possible to reduce degradation level bias in the blocks 403.

Figure 21:
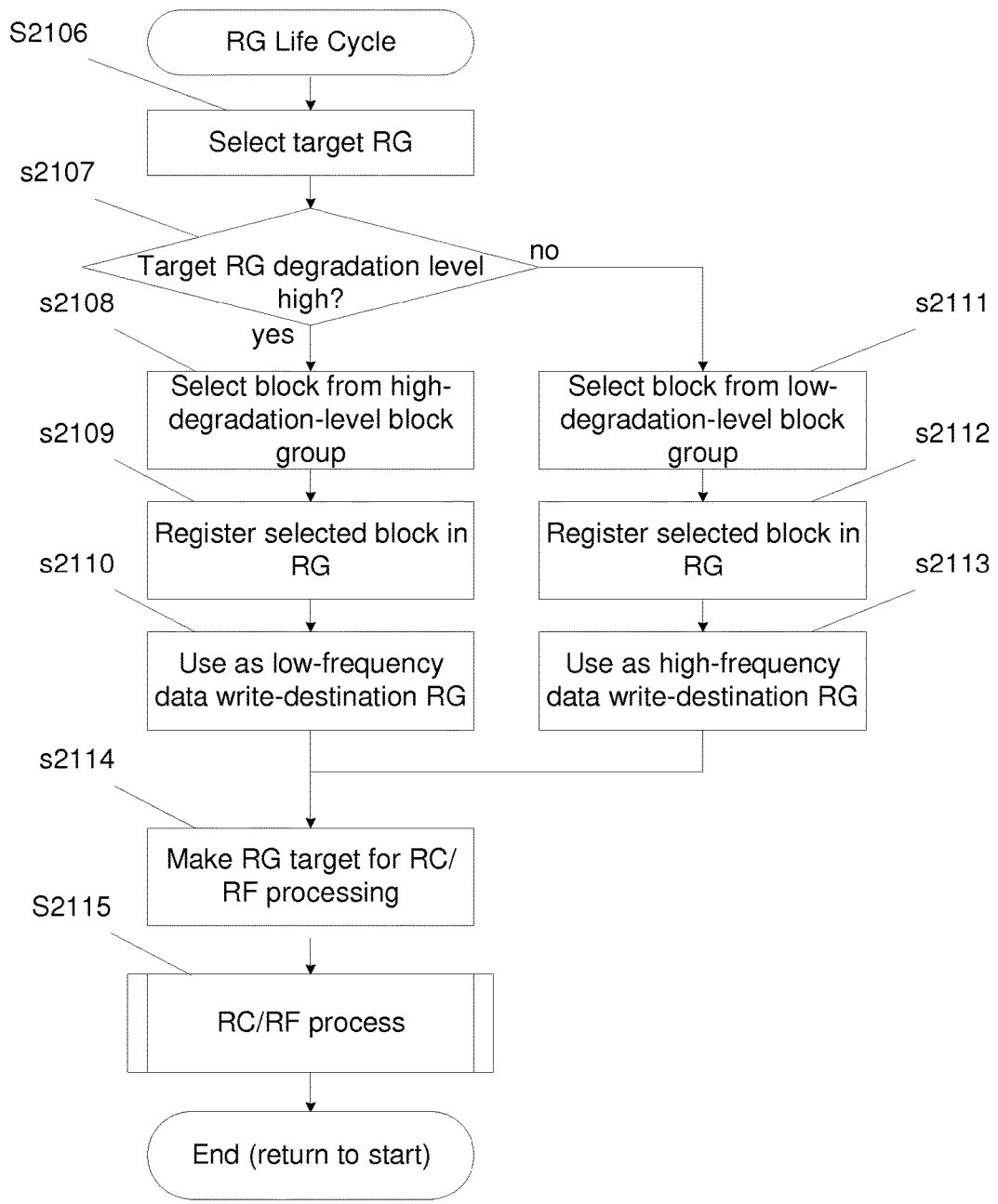
FIG. 21 is a flowchart of a dynamic management process for an RG 406.

FIG. 21 is a flowchart of a dynamic management process for an RG 406.

The memory 108 in this example additionally stores a dynamic management program (not shown in the drawing). A dynamic management process is performed in accordance with the CPU 107 booting up the dynamic management program. This process indicates the lifecycle of the RG 406. Thus, the dynamic management process may be routinely executed while the FM control apparatus 102 is operating.

When a write occurs as the result of a write request, in Step S2106, the dynamic management program selects one unused RG 406. For example, the dynamic management program selects the oldest "unused" RG 406 from among the RGs 406 with a status 1103 of "unused" in the RG management table 307. Hereinbelow, the selected RG 406 will be referred to as the target RG in this explanation.

In Step S2107, the dynamic management program determines whether or not the target RG is configured from blocks having high degradation levels. For example, the dynamic management program determines the degradation level of the target RG 406 on the basis of the write data frequency and/or the I/O type the same as in the data update process. When the determination result is true (S2107: Yes), the dynamic management program advances the processing to Step S2108. Alternatively, with the determination result is false (S2107: No), the dynamic management program advances the processing to Step S2111.

In Step S2108, the dynamic management program, on the basis of the empty block management information, selects as many "high" degradation level blocks 403 as there are number of blocks in the RG 406.

In Step S2109, the dynamic management program registers the selected blocks 403 in the block management table 308 and the RG configuration table 310 as the blocks configuring the target RG. Additionally, the dynamic management program sets the target RG degradation level 1106 to "high" in the RG management table 307 (S2110). After this step, the target RG 406 is selected as a low-frequency data write-destination RG.

In Step S2111, the dynamic management program, on the basis of the empty block management information, selects as many "low" degradation level blocks 403 as there are number of blocks in the RG 406.

In Step S2112, the dynamic management program registers the selected blocks 403 in the block management table 308 and the RG configuration table 310 as the blocks configuring the target RG. Additionally, the dynamic management program sets the target RG degradation level 1106 to "low" in the RG management table 307 (S2113). After this step, the target RG is selected as a high-frequency data write-destination RG 406.

In Step S2114, the dynamic management program makes an RG 406 in which empty pages no longer exist a target for a reclamation process/refresh process. For example, the dynamic management program sets the status 1103 in the RG management table 307 to "write-complete" for the RG 406 in which empty pages no longer exist.

The dynamic management program asynchronously executes a reclamation process/refresh process that invalidates and erases the RG targeted by the reclamation process/refresh process. In accordance therewith, the status 1103 of the RG in the RG management table 307 transitions from "erasable" to "unused", and the allocation of blocks to the RG ceases.

According to the above-described processing, as shown in FIG. 20, it is possible to configure an RG 406 using low degradation level blocks 403, and to select a write-destination RG in accordance with the write frequency of the write data. That is, wear leveling in RG units becomes possible.

Figure 22:
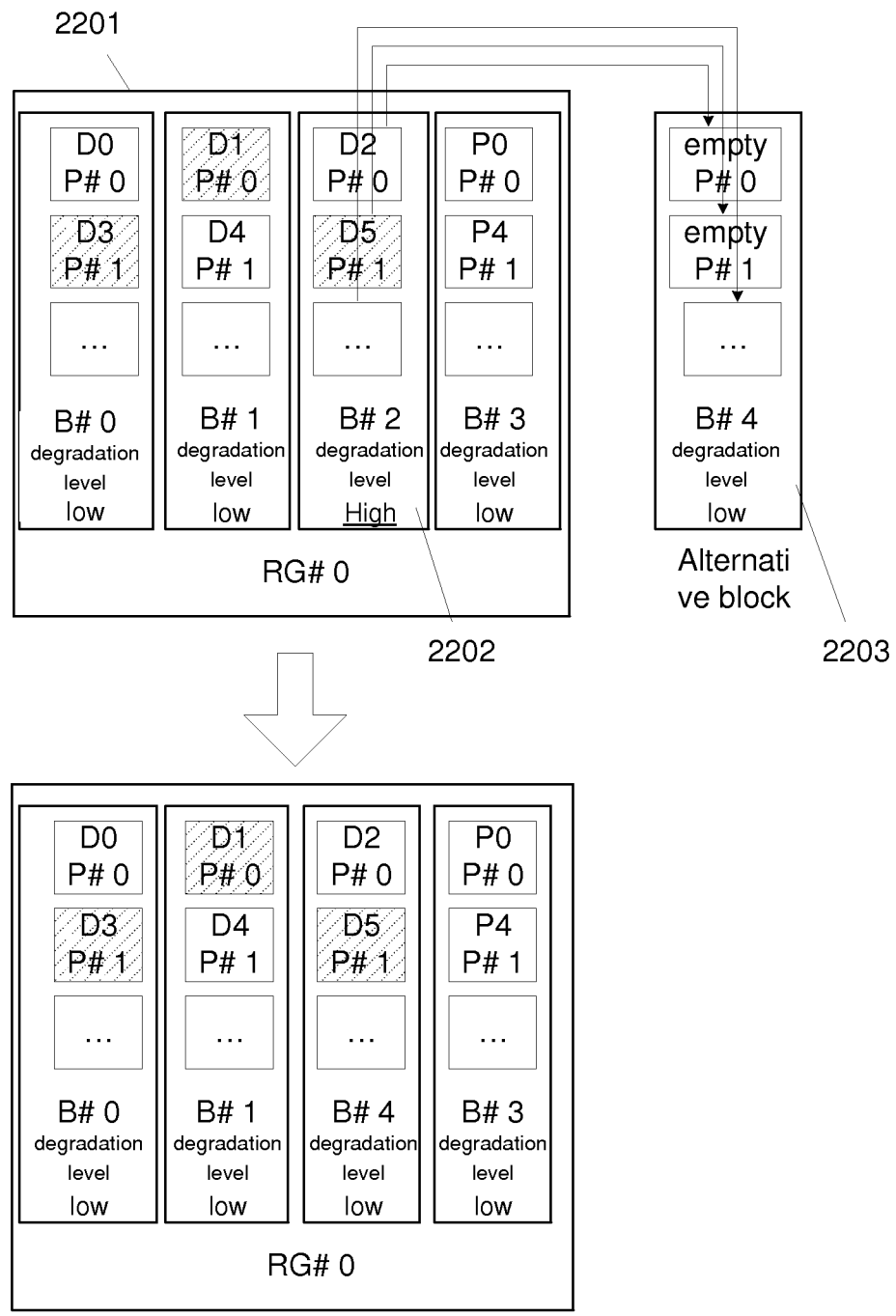
FIG. 22 shows an example of a block-unit refresh process.

FIG. 22 shows a block-unit refresh process.

The block-unit refresh process is performed for a target RG when the overall degradation level is not a problem but the degradation level is high for a specific block. The block-unit refresh process, for example, may be performed when a read command has been issued for a valid page in a specific block in the target RG and either an error or an error indication is detected. For example, when the degradation level is only high for the specific block B #2 in the target RG #0, the refresh process is performed for the specific block B #2.

In the block-unit refresh process, the FM control apparatus 102 selects an empty block as an alternative block for the specific block, and copies all the data in the specific block to the alternative block. The data copy is performed for both valid data and invalid data. For example, when the alternative block B #4 is selected, the valid data D2 and the invalid data D5 in the specific block #2 are copied to the alternative block #4.

During the block-unit refresh process, the alternative block #4 is registered as the alternative block. Then, after the refresh process has ended, the alternative block #4 is registered as a block configuring the target RG #0 in place of the specific block #2.

Figure 23:
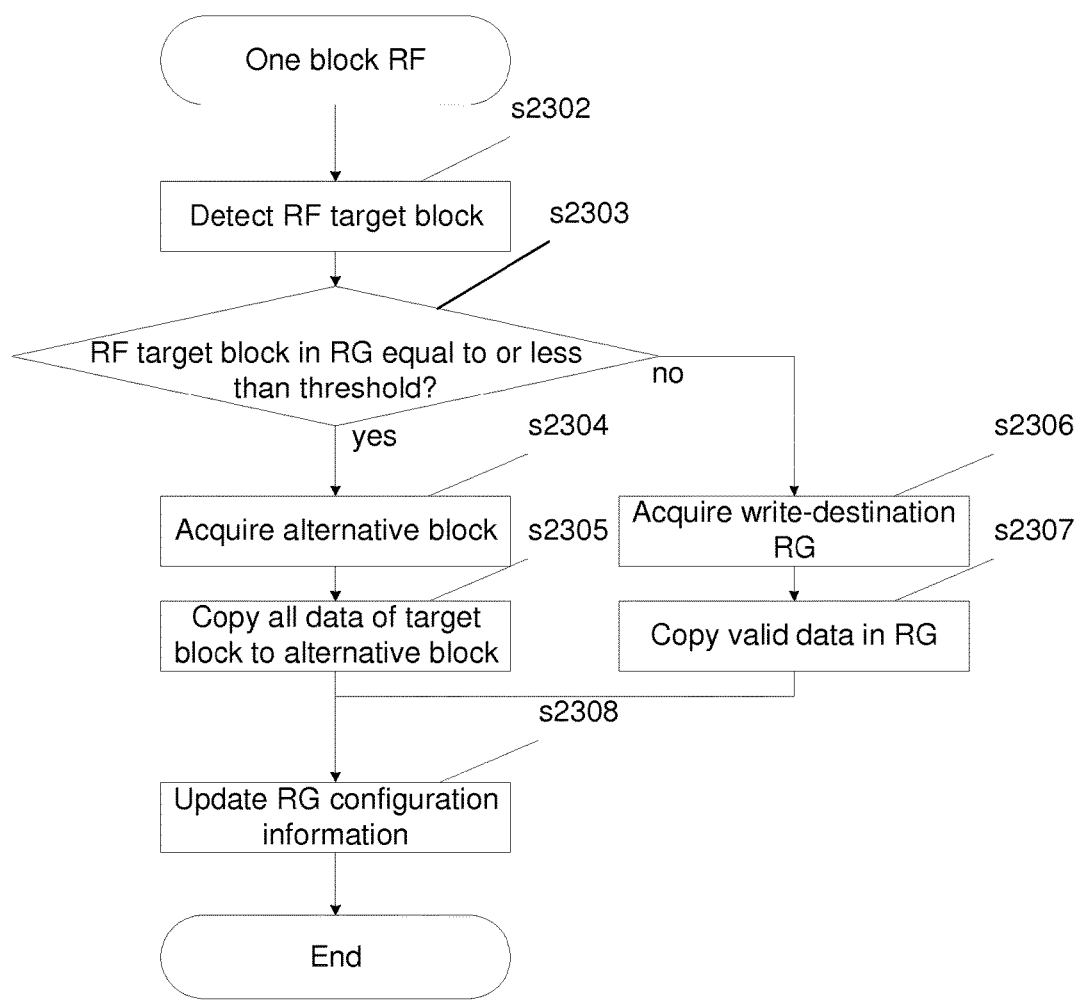
FIG. 23 is a flowchart of a block-unit refresh process.

FIG. 23 is a flowchart of the block-unit refresh process.

The block-unit refresh process is performed in accordance with the CPU 107 executing the reclamation processing/refresh processing program 312.

The program 312 starts the processing when the fact that the degradation level of the specific block is higher than that of the other blocks in the target RG has been detected (S2302).

In Step S2303, the program 312 determines whether or not the number of specific blocks in the target RG is equal to or less than a predetermined threshold for the number of specific blocks. This determination is for determining whether the block-unit refresh process is more efficient than the RG-unit refresh process. The threshold for the number of specific blocks, for example, is an absolute number, such as half of the number of blocks in the target RG, but the present invention is not limited thereto. For example, the threshold for the number of specific blocks, may be determined using a relative value, such as the ratio of the number of copy-target physical pages in the specific blocks to the number of valid pages in the target RG. Furthermore, the copy-target physical pages 404 include all the physical pages 404 regardless of whether valid pages or invalid pages. When the determination is true (S2303: Yes), the program 312 advances the processing to Step S2304. Alternatively, when the determination is false (S2303: No), the program 312 advances the processing to Step S2306.

In Step S2306, the program 312 selects the write-destination RG in the same way as in the RG-unit refresh process for the target RG. In Step S2307, the program 312 copies to the write-destination RG the data of the valid page(s) in the target RG the same way as in the RG-unit refresh process for the target RG, and moves the processing to S2308.

In Step S2304, the program 312 acquires the alternative block. The acquired block 403 is selected on the basis of the failure unit and/or the degradation level.

In Step S2305, the program 312 executes a data copy from the specific block to the alternative block.

In Step S2308, the program 312 updates the RG configuration table 310 and the RG management table 307, and ends the processing.

According to the above-described processing, when the degradation level of only a specific block of the target RG increases, a refresh process can be realized for the specific block alone without performing a refresh process for all of the blocks in the target RG 406. This makes it possible reduce the cost of executing the refresh process. It is also possible to flexibly select either a block-unit refresh process or an RG-unit refresh process in accordance with the state of the degradation level of the blocks 403 in the target RG.

In this example, the method to be used is selected in accordance with whether or not the block-unit refresh process is more efficient than the RG-unit refresh process, but the present invention is not limited thereto. A refresh process using either one of the units may be routinely executed after a prescribed policy has been determined.

In the above explanation, information about the present invention is explained using expressions such as "aaa table", "aaa queue", and "aaa list", but this information may also be expressed using a data structure other than a table or a queue. Thus, to show that this information is not dependent on the data structure, "aaa table", "aaa queue", "aaa list" and so forth may be called "aaa information".

In addition, when explaining the content of the respective information, the expressions "identification information", "number", and "name" are used, but these expressions are interchangeable.

In the above explanation, there may be cases where an explanation is given using "program" as the subject of the sentence, but since the stipulated processing is performed in accordance with a program being executed by a processor while using a memory and a communication port, the explanation may also give the processor as the subject. A process, which is disclosed having the program as the subject, may be regarded as a process performed by a management computer or an information processing apparatus. Furthermore, either all or a portion of a program may be realized using dedicated hardware.

Also, the same reference signs are used to explain the common configurations in the drawings. Regarding the common configurations, either a letter of the alphabet is appended at the end of a numeral, such as 999a, 999b, or an individual number such as #1, #2 is attached. However, explanations may be given by omitting the alphabetic letter or number as needed.

Various types of programs may be installed in the computers using a program delivery server or computer-readable storage media.

The present invention is not limited to the examples described above. The nonvolatile memory in the above-described examples is flash memory (FM). The FM in the examples is a type of FM, typically a NAND-type flash memory in which an erase is performed in block units and a read and a write are performed in page units. However, the FM may be another type of flash memory (for example, a NOR type) rather than the NAND type. Also, another type of nonvolatile memory may be used instead of FM, for example, a semiconductor memory such as a magnetoresistive random access memory (MRAM), which is a magnetoresistance memory, a resistance random access memory (ReRAM), which is a resistance change memory, or a ferroelectric random access memory (FeRAM), which is a ferroelectric memory, or a phase change memory.

The technology explained using the above examples can also be expressed as follows.

In the storage apparatus of the present invention, a non-volatile semiconductor memory chip corresponds to the FM chip 110, and a control device corresponds to the FM control apparatus 102.

REFERENCE SIGNS LIST

101 Flash memory storage apparatus
102 Flash memory control apparatus
103 Storage interface
104 Flash memory controller
105 Buffer 106 Battery
108 Main memory
109 Flash memory interface
110 Flash memory chip

The invention claimed is:

1. A storage apparatus, comprising:
a plurality of nonvolatile semiconductor memory chips; and
a control device including a memory connected to a higher-level apparatus,
wherein the control device is configured to:
store transformation information respectively associating a plurality of physical areas of the plurality of nonvolatile semiconductor memory chips with a plurality of logical areas provided to the higher-level apparatus;
store a plurality of first user data included in a first stripe and a first parity data, created on the basis of the plurality of first user data, in a plurality of first physical areas of the plurality of physical areas;
in accordance with receiving a plurality of write requests of data, store the data of each write request in a second stripe in a plurality of second physical areas of the plurality of physical areas that differ from the plurality of first physical areas and upon each instance of receiving a write request of the plurality of write requests, create intermediate parity data based on previous intermediate parity data stored in the memory and the latest received write request of the plurality of write requests, wherein only the intermediate parity data, among the plurality of write request data and the intermediate parity data, is stored in the memory of the control device;
wherein at least one of the write requests of the plurality of write requests received is a write request of data for a first logical area associated with a first physical area of the plurality of first physical areas, for updating a portion of the first user data of the plurality of first user data, which is stored in the first physical area of the plurality of physical areas;
upon determining that a total capacity of the write requests written in the second stripe has reached a capacity of the second stripe, create second parity data based on the created intermediate parity data and write the second parity data into the second stripe;
store an association, with respect to the transformation information, of the second physical areas with the first logical area; and
maintain the data stored in the plurality of first physical areas and upon determining the first plurality of physical areas are not associated with the first logical area in the transformation information, erases the first plurality of physical areas.

2. The storage apparatus according to claim 1, wherein the plurality of physical areas belong to different nonvolatile semiconductor memory chips of the plurality of nonvolatile semiconductor memory chips.

3. The storage apparatus according to claim 2, wherein the control device, upon determining data read from a third physical area in the first stripe has failed, restores the read-failure data on the basis of data in a physical area other than the third physical area in the first stripe.

4. The storage apparatus according to claim 3, wherein the nonvolatile semiconductor memory chip includes a plurality of blocks,
each of the plurality of blocks includes a plurality of pages,
each of the plurality of physical areas is a page, and the control device performs a read or a write for each page, and performs erasing for each block.

5. The storage apparatus according to claim 4, wherein the control device:
stores a degradation level indicating the degradation of each block group formed by the plurality of blocks including a stripe; and
selects a block group on the basis of the degradation level.

6. The storage apparatus according to claim 5, wherein the control device:
stores a number of valid pages respectively included in a plurality of block groups;
selects a first block group from among the plurality of block groups on the basis of the number of valid pages;
selects a second block group from among the plurality of block groups on the basis of the degradation level; and
copies a stripe in the first block group to the second block group.

7. The storage apparatus according to claim 6, wherein the control device:
selects a third block group from among the plurality of block groups on the basis of the degradation level;
selects, from among the plurality of block groups, a fifth block group having a degradation level that is lower than a fourth block group degradation level; and
copies a stripe in the fourth block group to the fifth block group.

8. The storage apparatus according to claim 7, wherein the control device:
stores a write frequency for each of the plurality of logical areas; and
selects a write-destination block group on the basis of the first logical area write frequency.

9. The storage apparatus according to claim 8, wherein the control device:
stores a block degradation level indicating a degradation of each of the plurality of blocks; and
selects a plurality of blocks on the basis of the block degradation level, and creates the block group using the selected plurality of blocks.

10. A storage system, comprising:
a storage controller; and
a storage apparatus,
wherein the storage apparatus comprises:
a plurality of nonvolatile semiconductor memory chips; and
a control device including a memory connected to the storage controller,
wherein the control device is configured to:
store transformation information respectively associating a plurality of physical areas of the plurality of nonvolatile semiconductor memory chips, with a plurality of logical areas provided to the storage controller;
store a plurality of first user data included in a first stripe and a first parity data created on the basis of the plurality of first user data in a plurality of first physical areas of the plurality of physical areas;
in accordance with receiving a plurality of write requests of data, store the data of each write request in a second stripe in a plurality of second physical areas of the plurality of physical areas that differ from the plurality of first physical areas and upon each instance of receiving a write request of the plurality of write requests, create intermediate parity data based on previous intermediate parity data and the latest received write request of the plurality of write requests, wherein only the intermediate parity data, among the plurality of write request data and the intermediate parity data, is stored in the memory of the control device, wherein at least one of the write requests of the plurality of write requests received is a write request of data for a first logical area associated with a first physical area of the plurality of first physical areas, for updating a portion of the first user data of the plurality of first user data, which is stored in the first physical area of the plurality of physical areas;

upon determining that a total capacity of the write requests written in the second stripe has reached a capacity of the second stripe, create second parity data based on the new intermediate parity data and write the second parity data into the second stripe;

store an association, with respect to the transformation information, of the second physical areas with the first logical area; and maintain the data stored in the plurality of first physical areas and upon determining the first plurality of physical areas are not associated with the first logical area in the transformation information, erase the first plurality of physical areas.

11. A storage apparatus control method executed by a storage apparatus that includes a plurality of nonvolatile semiconductor memory chips, and a control device including a memory connected to a higher-level apparatus and the nonvolatile semiconductor memory chips, the method operating the control device to:

store transformation information respectively associating a plurality of physical areas of the plurality of nonvolatile semiconductor memory chips, with a plurality of logical area provided to the higher-level apparatus;

store a plurality of first user data included in a first stripe and a first parity data created on the basis of the plurality of first user data in a plurality of first physical areas of the plurality of physical areas;

in accordance with receiving a plurality of write requests of data, store the data of each write request in a second stripe in a plurality of second physical areas of the plurality of physical areas that differ from the plurality of first physical areas and upon each instance of receiving a write request of the plurality of write requests, create intermediate parity data based on previous intermediate parity data and the latest received write request of the plurality of write requests, wherein only the intermediate parity data, among the plurality of write request data and the intermediate parity data, is stored in the memory of the control device, wherein at least one of the write requests of the plurality of write requests received is a write request of data for a first logical area associated with a first physical area of the plurality of first physical areas, for updating a portion of the first user data of the plurality of first user data, which is stored in the first physical area of the plurality of physical areas;

upon determining that a total capacity of the write requests written in the second stripe has reached a capacity of the second stripe, create second parity data based on the new intermediate parity data and write the second parity data into the second stripe;

store an association, with respect to the transformation information, of the plurality of second physical areas with the first logical area; and maintain the data stored in the plurality of first physical areas and upon determining the first plurality of physical areas are not associated with the first logical area in the transformation information, erase the first plurality of physical areas.

\* \* \* \* \*